(12) United States Patent
Joo

(10) Patent No.: US 11,270,752 B2
(45) Date of Patent: Mar. 8, 2022

(54) SEMICONDUCTOR DEVICES AND REFRESH METHODS USING THE SEMICONDUCTOR DEVICES

(71) Applicant: SK hynix Inc., Icheon-si (KR)

(72) Inventor: No Geun Joo, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/011,394

(22) Filed: Sep. 3, 2020

(65) Prior Publication Data
US 2021/0335416 A1    Oct. 28, 2021

(30) Foreign Application Priority Data

Apr. 24, 2020 (KR) .................. 10-2020-0050394

(51) Int. Cl.
| | | |
|---|---|---|
| G11C 7/00 | (2006.01) | |
| G11C 11/406 | (2006.01) | |
| G11C 11/408 | (2006.01) | |
| G11C 11/4096 | (2006.01) | |

(52) U.S. Cl.
CPC .... *G11C 11/40618* (2013.01); *G11C 11/4085* (2013.01); *G11C 11/4087* (2013.01); *G11C 11/4096* (2013.01); *G11C 11/40615* (2013.01)

(58) Field of Classification Search
CPC .............................................. G11C 11/40618
USPC ........................................................ 365/222
See application file for complete search history.

(56) References Cited

U.S. PATENT DOCUMENTS

| | | | |
|---|---|---|---|
| 2016/0155490 A1* | 6/2016 | Shin .................... | G11C 11/4087 365/203 |
| 2016/0351248 A1* | 12/2016 | Jung .................... | G11C 29/783 |

FOREIGN PATENT DOCUMENTS

KR        1020160011015 A        1/2016

* cited by examiner

*Primary Examiner* — Hoai V Ho
(74) *Attorney, Agent, or Firm* — William Park & Associates Ltd.

(57) ABSTRACT

A semiconductor device includes a peripheral circuit and a core circuit. The peripheral circuit enters a smart refresh mode in which a smart refresh operation is performed based on a command. The peripheral circuit generates a latch address signal from a target address signal to output the latch address signal through a global input/output (I/O) line in the smart refresh mode. The core circuit performs an adding operation and a subtracting operation of the latch address signal to generate first and second internal address signals. The core circuit performs the smart refresh operation for first and second banks based on the first and second internal address signals.

23 Claims, 14 Drawing Sheets

FIG. 2
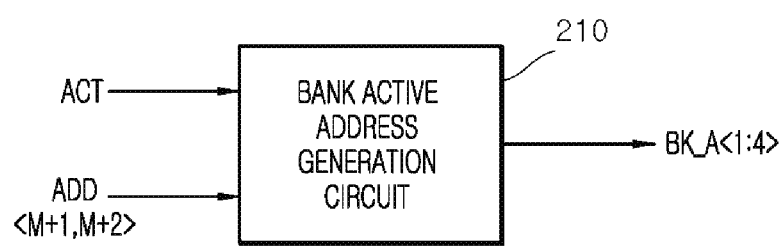
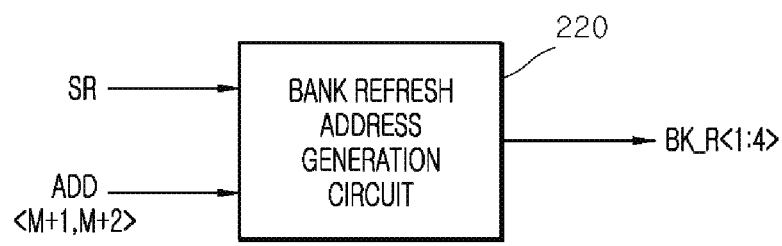

SEMICONDUCTOR DEVICES AND REFRESH METHODS USING THE SEMICONDUCTOR DEVICES

CROSS-REFERENCE TO RELATED APPLICATIONS

The present application claims priority under 35 U.S.C 119(a) to Korean Patent Application No. 10-2020-0050394, filed on Apr. 24, 2020, which is incorporated herein by references in its entirety.

BACKGROUND

1. Technical Field

Embodiments of the present disclosure relate to semiconductor devices performing a smart refresh operation for a target address and refresh methods using the smart refresh operation.

2. Related Art

Each of semiconductor devices such as dynamic random access memory (DRAM) devices may include a plurality of cell arrays, and each of the plurality of cell arrays may include a plurality of memory cells for storing data. Each of the plurality of memory cells may be designed to include a cell capacitor and a cell transistor. The DRAM devices may store data therein by discharging or charging the cell capacitors. Once the cell capacitor is charged or discharged to store a datum therein, an amount of electric charges stored in the cell capacitor has to be ideally constant even though a time elapses. However, the amount of electric charges stored in the cell capacitor may actually vary because of a voltage level difference between the cell capacitor and a circuit adjacent to the cell capacitor or because of a leakage current of the cell capacitor. In particular, if the amount of electric charges stored in the cell capacitor is reduced, the cell capacitor may lose a datum stored therein to cause malfunction of the DRAM device. Thus, the DRAM devices may require a refresh operation to prevent the memory cells from losing their data.

As the semiconductor devices become more highly integrated with the development of process technologies, a distance between the memory cells as well as a distance between word lines connected to the memory cells have been continuously reduced. If a distance between the word lines is reduced, data stored in the adjacent memory cells may be changed due to a coupling phenomenon or an interference phenomenon between the word lines.

SUMMARY

According to an embodiment, a semiconductor device may include a peripheral circuit and a core circuit. The peripheral circuit may be configured to enter a smart refresh mode in which a smart refresh operation is performed based on a command and configured to generate a latch address signal from a target address signal in the smart refresh mode to output the latch address signal through a global input/output (I/O) line. The core circuit may be configured to perform an adding operation and a subtracting operation of the latch address signal to generate first and second internal address signals and configured to perform the smart refresh operation for first and second banks based on the first and second internal address signals.

According to another embodiment, a semiconductor device may include an address input circuit, an internal address generation circuit, and a memory bank. The address input circuit may be configured to generate a latch address signal from a target address signal to output the latch address signal through a global input/output (I/O) line during a smart refresh operation. The internal address generation circuit may be configured to generate first and second internal address signals by performing an adding operation and a subtracting operation of the latch address signal based on first and second bank active address signals and first and second bank refresh address signals. The internal address generation circuit may be configured to output the first and second internal address signals through a local I/O line. The memory bank may include a first bank and a second bank. The memory bank may be configured to perform the smart refresh operation for the first bank based on the first internal address signal. The memory bank may be configured to perform the smart refresh operation for the second bank based on the second internal address signal.

According to yet another embodiment, there may be provided a refresh method. The refresh method may include generating a bank active address signal and a bank refresh address signal from an address signal during a smart refresh operation, generating a latch address signal from a target address signal during the smart refresh operation, and generating the internal address signal by performing an adding operation and a subtracting operation according to a logic level of a specific bit signal of the latch address signal to perform the smart refresh operation for a bank which is activated according to the bank active address signal and the bank refresh address signal.

BRIEF DESCRIPTION OF THE DRAWINGS

FIG. 2 is a block diagram illustrating a configuration of a bank address generation circuit included in the semiconductor device illustrated in FIG. 1.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

As mentioned above, if the distance between the word lines is reduced, data stored in the adjacent memory cells may be changed due to a coupling phenomenon or an interference phenomenon between the word lines. As such, a smart refresh operation corresponding to an additional refresh operation has been applied to word lines adjacent to a target word line, which is frequently accessed or activated, in order to prevent the memory cells connected to the word lines adjacent to the target word line from losing their data due to the interference phenomenon between the word lines. An adding operation and a subtracting operation of addresses for accessing to two word lines adjacent to the target word line have to be executed to perform the smart refresh operation, and addresses generated by the adding operation and the subtracting operation may be sequentially outputted to a core circuit through a global input/output (I/O) line to perform the smart refresh operation.

Figure 1:
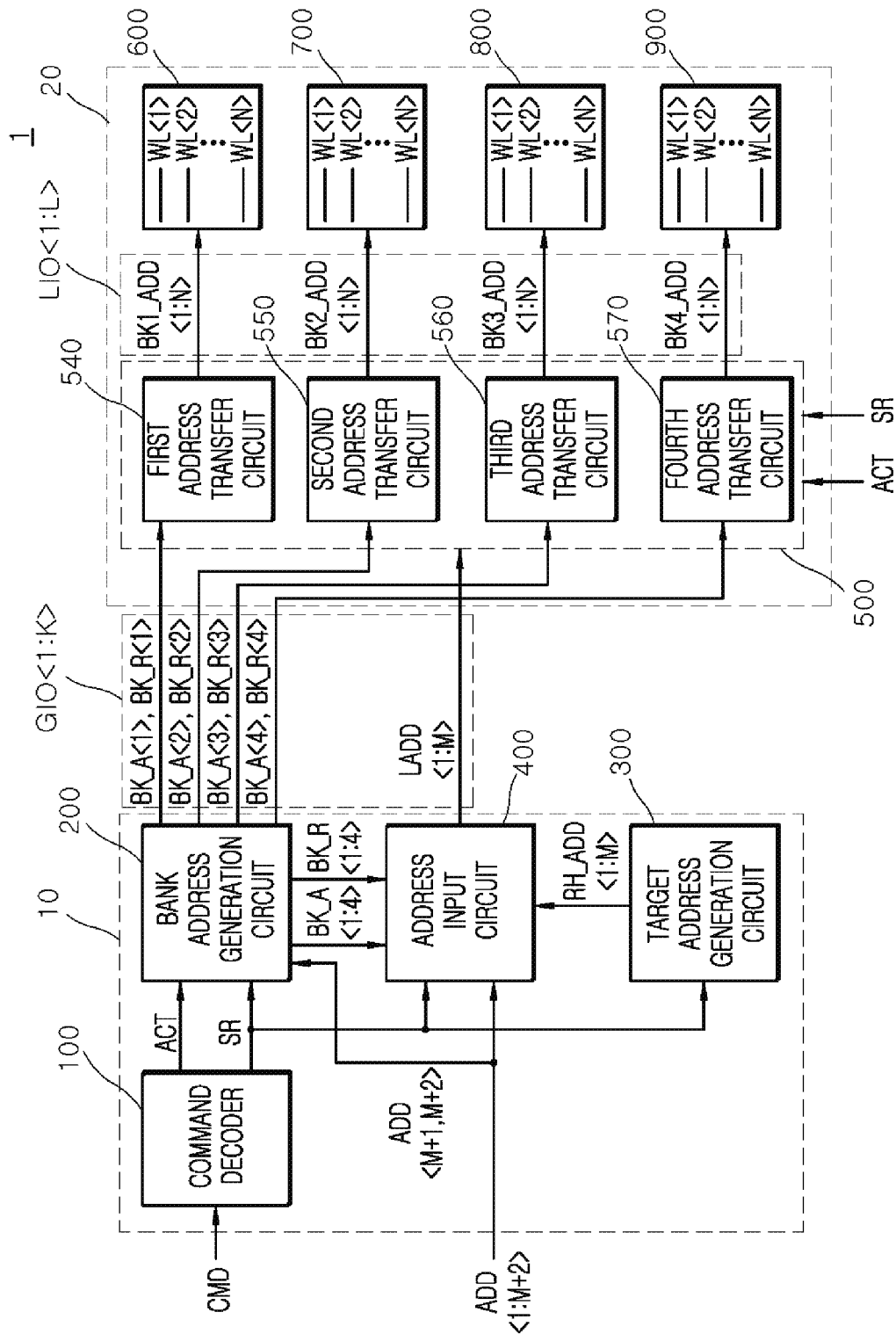
FIG. 1 is a block diagram illustrating a configuration of a semiconductor device according to an embodiment of the present disclosure.

As illustrated in FIG. 1, a semiconductor device 1 according to an embodiment may include a peripheral circuit 10 and a core circuit 20.

The peripheral circuit 10 may include a command decoder 100, a bank address generation circuit 200, a target address generation circuit 300, and an address input circuit 400.

The command decoder 100 may decode a command CMD to generate an active signal ACT and a refresh signal SR. The command decoder 100 may decode the command CMD to generate the active signal ACT which is enabled to enter a smart refresh operation. The command decoder 100 may decode the command CMD to generate the refresh signal SR including a first pulse and s second pulse which are sequentially created during the smart refresh operation. The command decoder 100 may decode the command CMD to generate the active signal ACT which is enabled to enter a normal operation. The command decoder 100 may decode the command CMD to generate the refresh signal SR which is disabled during the normal operation. Although the command CMD is illustrated with one signal line in FIG. 1, the command CMD may be set as a signal including a plurality of bits.

The bank address generation circuit 200 may receive $(M+1)^{th}$ and $(M+2)^{th}$ address signals ADD<(M+1):(M+2)> to generate first to fourth bank active address signals BK_A<1:4> and first to fourth bank refresh address signals BK_R<1:4> when the active signal ACT and the refresh signal SR are input to the bank address generation circuit 200. The bank address generation circuit 200 may generate the first to fourth bank active address signals BK_A<1:4>, one of which is selectively enabled according to logic levels of the $(M+1)^{th}$ and $(M+2)^{th}$ address signals ADD<(M+1):(M+2)> when the active signal ACT is enabled. The bank address generation circuit 200 may generate the first to fourth bank refresh address signals BK_R<1:4>, one of which is selectively enabled according to logic levels of the $(M+1)^{th}$ and $(M+2)^{th}$ address signals ADD<(M+1):(M+2)> when the refresh signal SR is enabled. The $(M+1)^{th}$ and $(M+2)^{th}$ address signals ADD<(M+1):(M+2)> may correspond to bit signals for selecting one of first to fourth banks 600, 700, 800, and 900 included in the core circuit 20. In an embodiment, 'M' is an integer that may have a variable value. Maybe though M is an integer that is greater than 1.

The target address generation circuit 300 may generate first to $M^{th}$ target address signals RH_ADD<1:M> when the refresh signal SR is input. The target address generation circuit 300 may be realized using a register and may output the first to $M^{th}$ target address signals RH_ADD<1:M> stored therein when the refresh signal SR is input. The first to $M^{th}$ target address signals RH_ADD<1:M> may include information on locations of word lines, which are activated at least a predetermined number of times, among all of word lines included in the first to fourth banks 600, 700, 800, and 900. The predetermined number of times may be set as the number of times that a target word line is activated until data of memory cells connected to word lines adjacent to the target word line are lost. The predetermined number of times may be set to be different according to the embodiments. If a distance between the word lines is reduced, the predetermined number of times may also be reduced. The word "predetermined" as used herein with respect to a parameter, such as a predetermined number of times, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The address input circuit 400 may generate first to $M^{th}$ latch address signals LADD<1:M> from first to $M^{th}$ address signals ADD<1:M> when the first to fourth bank active address signals BK_A<1:4> are input to the address input circuit 400. The address input circuit 400 may generate the first to $M^{th}$ latch address signals LADD<1:M> from the first to $M^{th}$ target address signals RH_ADD<1:M> when the refresh signal SR and the first to fourth bank refresh address signals BK_R<1:4> are input to the address input circuit 400.

The first to fourth bank active address signals BK_A<1:4>, the first to fourth bank refresh address signals BK_R<1:4>, and the first to $M^{th}$ latch address signals LADD<1:M> may be transmitted from the peripheral circuit 10 to the core circuit 20 through first to $K^{th}$ global I/O lines GIO<1:K>. The first to fourth bank active address signals BK_A<1:4> may be transmitted to the core circuit 20 through the first to fourth global I/O lines GIO<1:4>. The first to fourth bank refresh address signals BK_R<1:4> may be transmitted to the core circuit 20 through the fifth to eighth global I/O lines GIO<5:8>. The first to $M^{th}$ latch address signals LADD<1:M> may be transmitted to the core circuit 20 through the ninth to $K^{th}$ global I/O lines GIO<9:K>. The number "K" of the first to $K^{th}$ global I/O lines GIO<1:K> may be set to be equal to the total number of the first to fourth bank active address signals BK_A<1:4>, the first to fourth bank refresh address signals BK_R<1:4>, and the first to $M^{th}$ latch address signals LADD<1:M>. For example, when the number "M" of the first to $M^{th}$ latch address signals LADD<1:M> is set to be "8", the number "K" of the first to $K^{th}$ global I/O lines GIO<1:K> may be set to be "16".

The peripheral circuit 10 may be designed to include control circuits for controlling an operation of the core circuit 20 of the semiconductor device 1. The peripheral circuit 10 may output various signals for controlling an operation of the core circuit 20 through the first to $K^{th}$ global I/O lines GIO<1:K>.

The peripheral circuit 10 having an aforementioned configuration may enter a smart refresh mode in which the smart refresh operation is performed by the command CMD and may generate the first to fourth bank active address signals BK_A<1:4>, the first to fourth bank refresh address signals BK_R<1:4>, and the first to $M^{th}$ latch address signals LADD<1:M> from the first to $(M+2)^{th}$ address signals ADD<1:(M+2)> and the first to $M^{th}$ target address signals RH_ADD<1:M> during the smart refresh operation. The peripheral circuit 10 may output the first to fourth bank active address signals BK_A<1:4>, the first to fourth bank refresh address signals BK_R<1:4>, and the first to $M^{th}$ latch address signals LADD<1:M> to the core circuit 20 through the first to $K^{th}$ global I/O lines GIO<1:K>.

The core circuit 20 may include an internal address generation circuit 500, the first bank 600, the second bank 700, the third bank 800, and the fourth bank 900.

The internal address generation circuit 500 may include a first address transfer circuit 540, a second address transfer circuit 550, a third address transfer circuit 560, and a fourth address transfer circuit 570.

The internal address generation circuit 500 may generate first to fourth internal address signals BK1_ADD<1:N>, BK2_ADD<1:N>, BK3_ADD<1:N>, and BK4_ADD<1:N> from the first to fourth bank active address signals BK_A<1:4>, the first to fourth bank refresh address signals BK_R<1:4>, and the first to $M^{th}$ latch address signals LADD<1:M> when the active signal ACT and the refresh signal SR are input to the internal address generation circuit 500. The internal address generation circuit 500 may generate the first to fourth internal address signals BK1_ADD<1:N>, BK2_ADD<1:N>, BK3_ADD<1:N>, and BK4_ADD<1:N> by successively performing an adding operation and a subtracting operation of the first to fourth bank active address signals BK_A<1:4>, the first to fourth bank refresh address signals BK_R<1:4>, and the first to $M^{th}$ latch address signals LADD<1:M> based on the active signal ACT and the refresh signal SR during the smart refresh operation. The internal address generation circuit 500 may generate the first to fourth internal address signals BK1_ADD<1:N>, BK2_ADD<1:N>, BK3_ADD<1:N>, and BK4_ADD<1:N> from the first to fourth bank active address signals BK_A<1:4>, the first to fourth bank refresh address signals BK_R<1:4>, and the first to $M^{th}$ latch address signals LADD<1:M> based on the active signal ACT and the refresh signal SR while the normal operation is performed.

The first to fourth internal address signals BK1_ADD<1:N>, BK2_ADD<1:N>, BK3_ADD<1:N>, and BK4_ADD<1:N> may be output to the first to fourth banks 600-900 through first to $L^{th}$ local I/O lines LIO<1:L>. The first internal address signal BK1_ADD<1:N> may be outputted to the first bank 600 through the first to $N^{th}$ local I/O lines LIO<1:N>. The second internal address signal BK2_ADD<1:N> may be outputted to the second bank 700 through the $(N+1)^{th}$ to $2N^{th}$ local I/O lines LIO<(N+1):2N>. The third internal address signal BK3_ADD<1:N> may be outputted to the third bank 800 through the $(2N+1)^{th}$ to $3N^{th}$ local I/O lines LIO<(2N+1):3N>. The fourth internal address signal BK4_ADD<1:N> may be outputted to the fourth bank 900 through the $(3N+1)^{th}$ to $L^{th}$ local I/O lines LIO<(3N+1):L>. The number "L" of the first to $L^{th}$ local I/O lines LIO<1:L> may be set to be equal to the total number of the first to fourth internal address signals BK1_ADD<1:N>, BK2_ADD<1:N>, BK3_ADD<1:N>, and BK4_ADD<1:N>. For example, when the number "N" of each of the first to fourth internal address signals BK1_ADD<1:N>, BK2_ADD<1:N>, BK3_ADD<1:N>, and BK4_ADD<1:N> is set to be "8", the number "L" of the first to $L^{th}$ local I/O lines LIO<1:L> may be set to be "32".

Configurations and operations of the first address transfer circuit 540, the second address transfer circuit 550, the third address transfer circuit 560, and the fourth address transfer circuit 570 will be described below with reference to FIG. 6 later.

The first bank 600 may include first to $N^{th}$ word lines WL<1:N>. The first to $N^{th}$ word lines WL<1:N> included in the first bank 600 may be activated by the first internal address signal BK1_ADD<1:N>. The first bank 600 may perform the smart refresh operation by activating the first to $N^{th}$ word lines WL<1:N> based on the first internal address signal BK1_ADD<1:N>. The number "N" of the first to $N^{th}$ word lines WL<1:N> may be set to be equal to the number "N" of bits included in the first internal address signal BK1_ADD<1:N>.

The second bank 700 may also include first to $N^{th}$ word lines WL<1:N>. The first to $N^{th}$ word lines WL<1:N> included in the second bank 700 may be activated by the second internal address signal BK2_ADD<1:N>. The second bank 700 may perform the smart refresh operation by activating the first to $N^{th}$ word lines WL<1:N> based on the second internal address signal BK2_ADD<1:N>. The number "N" of the first to $N^{th}$ word lines WL<1:N> may be set to be equal to the number "N" of bits included in the second internal address signal BK2_ADD<1:N>.

The third bank 800 may also include first to $N^{th}$ word lines WL<1:N>. The first to $N^{th}$ word lines WL<1:N> included in the third bank 800 may be activated by the third internal address signal BK3_ADD<1:N>. The third bank 800 may perform the smart refresh operation by activating the first to $N^{th}$ word lines WL<1:N> based on the third internal address signal BK3_ADD<1:N>. The number "N" of the first to $N^{th}$ word lines WL<1:N> may be set to be equal to the number "N" of bits included in the third internal address signal BK3_ADD<1:N>.

The fourth bank 900 may also include first to $N^{th}$ word lines WL<1:N>. The first to $N^{th}$ word lines WL<1:N> included in the fourth bank 900 may be activated by the fourth internal address signal BK4_ADD<1:N>. The fourth bank 900 may perform the smart refresh operation by activating the first to $N^{th}$ word lines WL<1:N> based on the fourth internal address signal BK4_ADD<1:N>. The number "N" of the first to $N^{th}$ word lines WL<1:N> may be set to be equal to the number "N" of bits included in the fourth internal address signal BK4_ADD<1:N>.

The core circuit 20 may be realized using a general memory circuit including banks having a plurality of memory cells.

The core circuit 20 having an aforementioned configuration may generate the first to fourth internal address signals BK1_ADD<1:N>, BK2_ADD<1:N>, BK3_ADD<1:N>, and BK4_ADD<1:N> by successively performing an adding operation and a subtracting operation of the first to fourth bank active address signals BK_A<1:4>, the first to fourth bank refresh address signals BK_R<1:4>, and the first to $M^{th}$ latch address signals LADD<1:M> during the smart refresh operation. The core circuit 20 may perform the smart refresh operation for activating two word lines, which are adjacent to a target word line selected by a target address, based on the first to fourth internal address signals BK1_ADD<1:N>, BK2_ADD<1:N>, BK3_ADD<1:N>, and BK4_ADD<1:N> which are generated by the adding operation and the subtracting operation in the smart refresh mode. The core circuit 20 may generate the first to fourth internal address signals BK1_ADD<1:N>, BK2_ADD<1:N>, BK3_ADD<1:N>, and BK4_ADD<1:N> from the first to fourth bank active address signals BK_A<1:4>, the first to fourth bank refresh address signals BK_R<1:4>, and the first to $M^{th}$ latch address signals LADD<1:M> during the normal operation.

Referring to FIG. 2, the bank address generation circuit 200 may include a bank active address generation circuit 210 and a bank refresh address generation circuit 220.

The bank active address generation circuit 210 may receive the $(M+1)^{th}$ and $(M+2)^{th}$ address signals ADD<(M+1):(M+2)> to generate the first to fourth bank active address signals BK_A<1:4> when the active signal ACT is input. The bank active address generation circuit 210 may generate the first to fourth bank active address signals BK_A<1:4>, one of which is selectively enabled according to logic levels of the $(M+1)^{th}$ and $(M+2)^{th}$ address signals ADD<(M+1):(M+2)> when the active signal ACT is input. Logic levels of the $(M+1)^{th}$ and $(M+2)^{th}$ address signals ADD<(M+1):(M+2)> for generating the first to fourth bank active address signals BK_A<1:4> will be described with reference to FIG. 3 later.

The bank refresh address generation circuit 220 may receive the $(M+1)^{th}$ and $(M+2)^{th}$ address signals ADD<(M+1):(M+2)> to generate the first to fourth bank refresh address signals BK_R<1:4> when the refresh signal SR is input. The bank refresh address generation circuit 220 may generate the first to fourth bank refresh address signals BK_R<1:4>, one of which is selectively enabled according to logic levels of the $(M+1)^{th}$ and $(M+2)^{th}$ address signals ADD<(M+1):(M+2)> when the refresh signal SR is input. Logic levels of the $(M+1)^{th}$ and $(M+2)^{th}$ address signals ADD<(M+1):(M+2)> for generating the first to fourth bank refresh address signals BK_R<1:4> will be described in detail with reference to FIG. 4 later.

Figure 3:
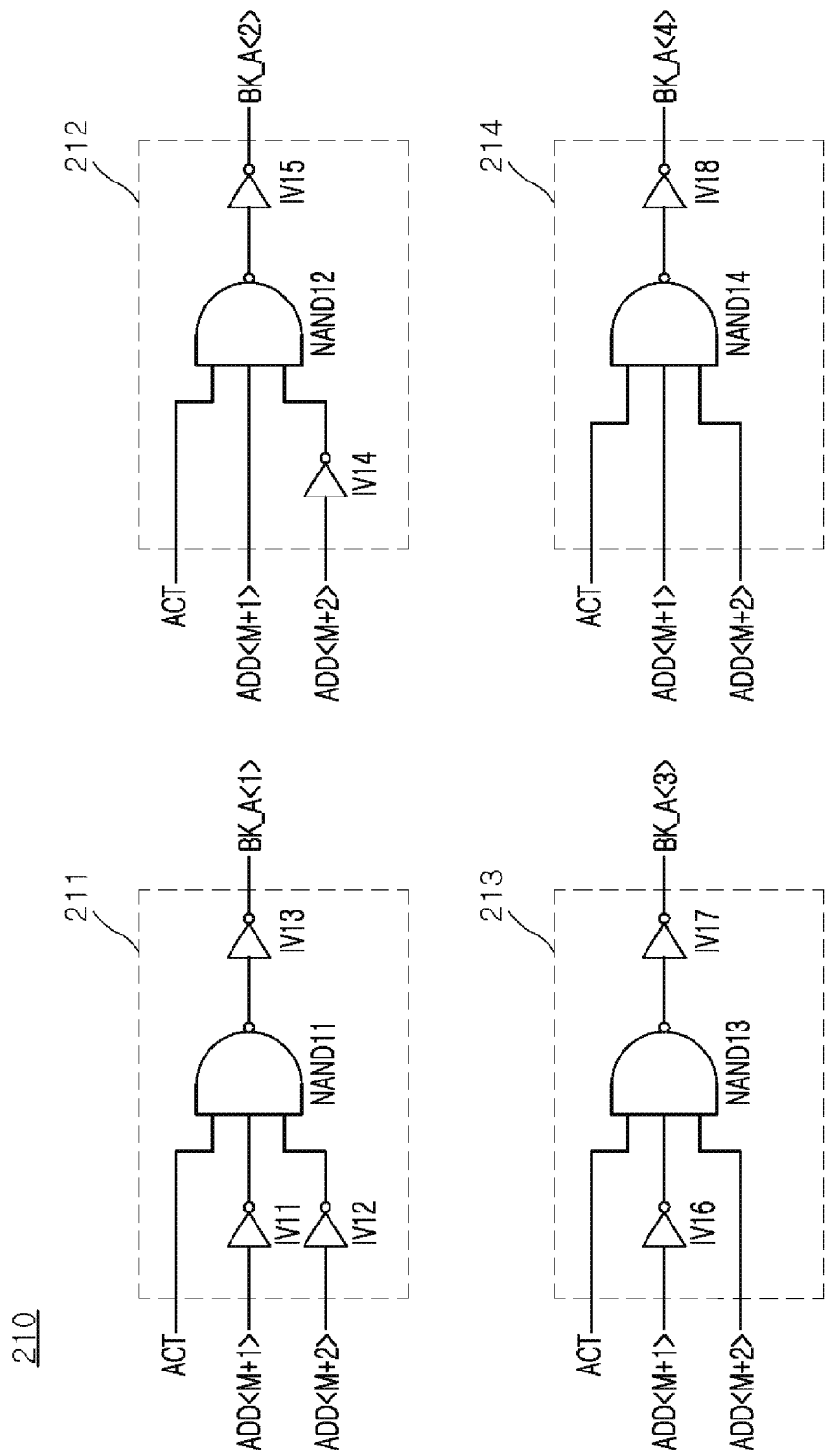
FIG. 3 is a circuit diagram illustrating a configuration of a bank active address generation circuit included in the bank address generation circuit illustrated in FIG. 2.

Referring to FIG. 3, the bank active address generation circuit 210 may include a first bank active address generation circuit 211, a second bank active address generation circuit 212, a third bank active address generation circuit 213, and a fourth bank active address generation circuit 214.

The first bank active address generation circuit 211 may be realized using inverters IV11, IV12, and IV13 and a NAND gate NAND11. The first bank active address generation circuit 211 may generate the first bank active address signal BK_A<1> having a logic "high" level when the active signal ACT is enabled to have a logic "high" level, the $(M+1)^{th}$ address signal ADD<M+1> has a logic "low" level, and the $(M+2)^{th}$ address signal ADD<M+2> has a logic "low" level.

The second bank active address generation circuit 212 may be realized using inverters IV14 and IV15 and a NAND gate NAND12. The second bank active address generation circuit 212 may generate the second bank active address signal BK_A<2> having a logic "high" level when the active signal ACT is enabled to have a logic "high" level, the $(M+1)^{th}$ address signal ADD<M+1> has a logic "high" level, and the $(M+2)^{th}$ address signal ADD<M+2> has a logic "low" level.

The third bank active address generation circuit 213 may be realized using inverters IV16 and IV17 and a NAND gate NAND13. The third bank active address generation circuit 213 may generate the third bank active address signal BK_A<3> having a logic "high" level when the active signal ACT is enabled to have a logic "high" level, the $(M+1)^{th}$ address signal ADD<M+1> has a logic "low" level, and the $(M+2)^{th}$ address signal ADD<M+2> has a logic "high" level.

The fourth bank active address generation circuit 214 may be realized using an inverter IV18 and a NAND gate NAND14. The fourth bank active address generation circuit 214 may generate the fourth bank active address signal BK_A<4> having a logic "high" level when the active signal ACT is enabled to have a logic "high" level, the $(M+1)^{th}$ address signal ADD<M+1> has a logic "high" level, and the $(M+2)^{th}$ address signal ADD<M+2> has a logic "high" level.

Figure 4:
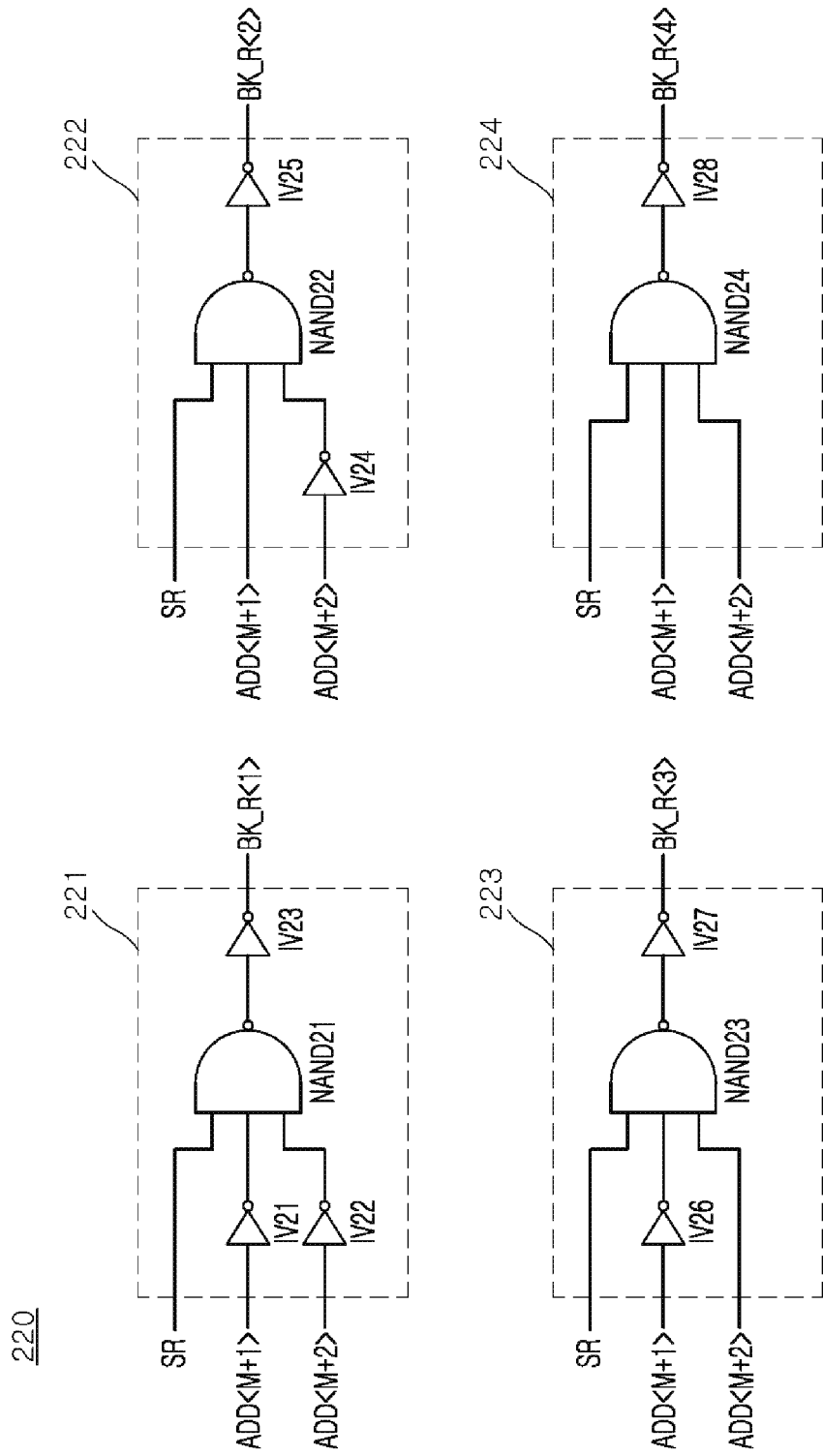
FIG. 4 is a circuit diagram illustrating a configuration of a bank refresh address generation circuit included in the bank address generation circuit illustrated in FIG. 2.

Referring to FIG. 4, the bank refresh address generation circuit 220 may include a first bank refresh address generation circuit 221, a second bank refresh address generation circuit 222, a third bank refresh address generation circuit 223, and a fourth bank refresh address generation circuit 224.

The first bank refresh address generation circuit 221 may be realized using inverters IV21, IV22, and IV23 and a NAND gate NAND21. The first bank refresh address generation circuit 221 may generate the first bank refresh address signal BK_R<1> having a logic "high" level when the refresh signal SR is enabled to have a logic "high" level, the $(M+1)^{th}$ address signal ADD<M+1> has a logic "low" level, and the $(M+2)^{th}$ address signal ADD<M+2> has a logic "low" level.

The second bank refresh address generation circuit 222 may be realized using inverters IV24 and IV25 and a NAND gate NAND22. The second bank refresh address generation circuit 222 may generate the second bank refresh address signal BK_R<2> having a logic "high" level when the refresh signal SR is enabled to have a logic "high" level, the $(M+1)^{th}$ address signal ADD<M+1> has a logic "high" level, and the $(M+2)^{th}$ address signal ADD<M+2> has a logic "low" level.

The third bank refresh address generation circuit 223 may be realized using inverters IV26 and IV27 and a NAND gate NAND23. The third bank refresh address generation circuit 223 may generate the third bank refresh address signal BK_R<3> having a logic "high" level when the refresh signal SR is enabled to have a logic "high" level, the $(M+1)^{th}$ address signal ADD<M+1> has a logic "low" level, and the $(M+2)^{th}$ address signal ADD<M+2> has a logic "high" level.

The fourth bank refresh address generation circuit 224 may be realized using inverters IV28 and a NAND gate NAND24. The fourth bank refresh address generation circuit 224 may generate the fourth bank refresh address signal BK_R<4> having a logic "high" level when the refresh signal SR is enabled to have a logic "high" level, the $(M+1)^{th}$ address signal ADD<M+1> has a logic "high" level, and the $(M+2)^{th}$ address signal ADD<M+2> has a logic "high" level.

Figure 5:
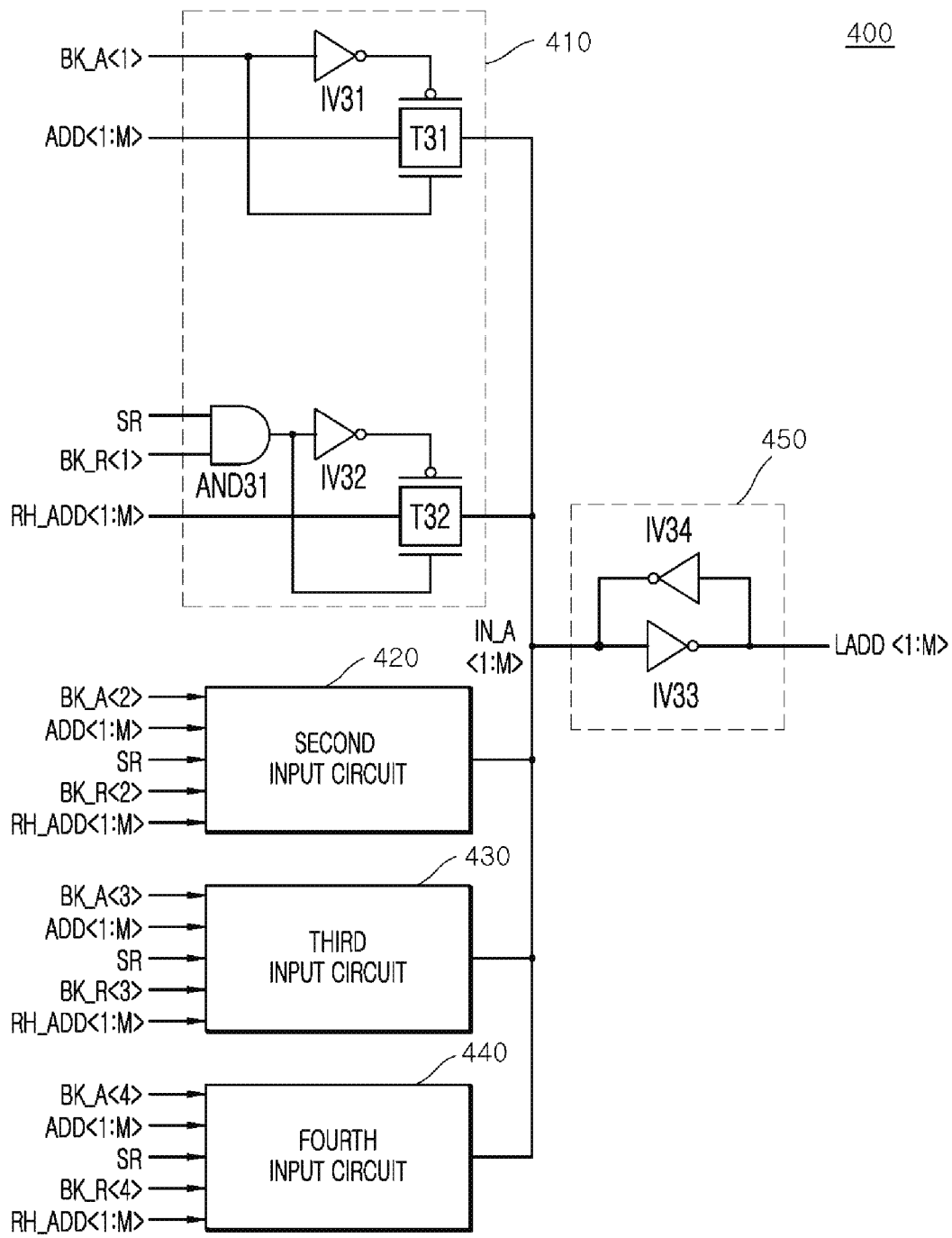
FIG. 5 illustrates a configuration of an address input circuit included in the semiconductor device illustrated in FIG. 1.

Referring to FIG. 5, the address input circuit 400 may include a first input circuit 410, a second input circuit 420, a third input circuit 430, a fourth input circuit 440, and a latch circuit 450.

The first input circuit 410 may generate first to $M^{th}$ input address signals IN_A<1:M> from the first to $M^{th}$ address signals ADD<1:M> when the first bank active address signal BK_A<1> is input. The first input circuit 410 may generate the first to $M^{th}$ input address signals IN_A<1:M> from the first to $M^{th}$ target address signals RH_ADD<1:M> when the refresh signal SR and the first bank refresh address signal BK_R<1> are input.

The second input circuit 420 may generate the first to $M^{th}$ input address signals IN_A<1:M> from the first to $M^{th}$ address signals ADD<1:M> when the second bank active address signal BK_A<2> is input. The second input circuit 420 may generate the first to $M^{th}$ input address signals IN_A<1:M> from the first to $M^{th}$ target address signals RH_ADD<1:M> when the refresh signal SR and the second bank refresh address signal BK_R<2> are input.

The third input circuit 430 may generate the first to $M^{th}$ input address signals IN_A<1:M> from the first to $M^{th}$ address signals ADD<1:M> when the third bank active address signal BK_A<3> is input. The third input circuit 430 may generate the first to $M^{th}$ input address signals IN_A<1:M> from the first to $M^{th}$ target address signals RH_ADD<1:M> when the refresh signal SR and the third bank refresh address signal BK_R<3> are input.

The fourth input circuit 440 may generate the first to $M^{th}$ input address signals IN_A<1:M> from the first to $M^{th}$ address signals ADD<1:M> when the fourth bank active address signal BK_A<4> is input. The fourth input circuit 440 may generate the first to $M^{th}$ input address signals IN_A<1:M> from the first to $M^{th}$ target address signals RH_ADD<1:M> when the refresh signal SR and the fourth bank refresh address signal BK_R<4> are input.

The latch circuit 450 may be realized using inverters IV33 and IV34. The latch circuit 450 may latch the first to $M^{th}$ input address signals IN_A<1:M> and may inversely buffer the latched signals of the first to $M^{th}$ input address signals IN_A<1:M> to generate the first to $M^{th}$ latch address signals LADD<1:M>.

A configuration and an operation of the first input circuit 410 will be described in more detail hereinafter.

The first input circuit 410 may be realized using inverters IV31 and IV32, an AND gate AND31, and transfer gates T31 and T32.

The first input circuit 410 may output the first to $M^{th}$ address signals as the first to $M^{th}$ input address signals IN_A<1:M> when the first bank active address signal BK_A<1> having a logic "high" level is input to the first input circuit 410.

The first input circuit 410 may output the first to $M^{th}$ target address signals RH_ADD<1:M> as the first to $M^{th}$ input address signals IN_A<1:M> when the refresh signal SR having a logic "high" level and the first bank refresh address signal BK_R<1> having a logic "high" level are input to the first input circuit 410.

Meanwhile, each of the second to fourth input circuits 420-440 may be realized using substantially the same circuit as the first input circuit 410 except its input/output (I/O) signals. Thus, detailed descriptions of the second to fourth input circuits 420-440 will be omitted hereinafter.

Figure 6:
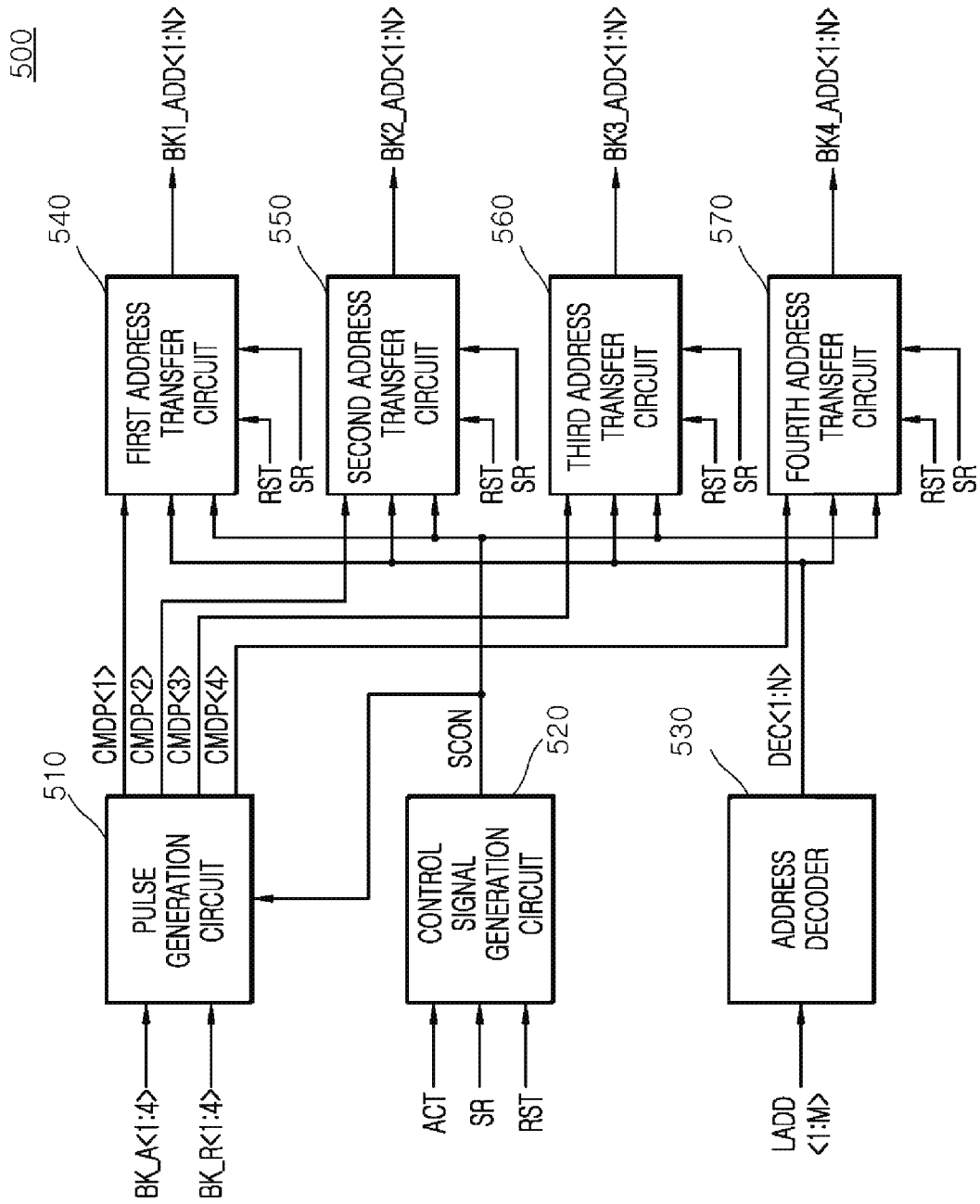
FIG. 6 is a block diagram illustrating a configuration of an internal address generation circuit included in the semiconductor device illustrated in FIG. 1.

Referring to FIG. 6, the internal address generation circuit 500 may include a pulse generation circuit 510, a control signal generation circuit 520, an address decoder 530, the first address transfer circuit 540, the second address transfer circuit 550, the third address transfer circuit 560, and the fourth address transfer circuit 570.

The pulse generation circuit 510 may generate first to fourth command pulse signals CMDP<1:4> including pulses which are generated from the first to fourth bank active address signals BK_A<1:4> or the first to fourth bank refresh address signals BK_R<1:4> when a control signal SCON is not input. The pulse generation circuit 510 may generate the first to fourth command pulse signals CMDP<1:4> which are disabled regardless of the first to fourth bank active address signals BK_A<1:4> and the first to fourth bank refresh address signals BK_R<1:4> when the control signal SCON is input.

The control signal generation circuit 520 may generate the control signal SCON which is disabled when a reset signal RST is input. The control signal generation circuit 520 may generate the control signal SCON which is enabled by the active signal ACT and the refresh signal SR. The control signal generation circuit 520 may generate the control signal SCON which is disabled when the active signal ACT is input and a first pulse of the refresh signal SR is disabled. The reset signal RST may be set as a signal including a pulse having a logic "high" level which is generated during an initialization operation of the semiconductor device 1.

The address decoder 530 may decode the first to $M^{th}$ latch address signals LADD<1:M> to generate first to $N^{th}$ decoded signals DEC<1:N>, one of which is selectively enabled. The address decoder 530 may be realized using a general decoder that receives an "M"-bit signal to generate an "N"-bit signal.

The first address transfer circuit 540 may generate the first internal address signal BK1_ADD<1:N> according to logic levels of the reset signal RST, the first command pulse signal CMDP<1>, and the first to $N^{th}$ decoded signals DEC<1:N> when the refresh signal SR is disabled. The first address transfer circuit 540 may generate the first internal address signal BK1_ADD<1:N> by performing an adding operation and a subtracting operation according to logic levels of the first command pulse signal CMDP<1> and the first to $N^{th}$ decoded signals DEC<1:N> based on the control signal SCON when the refresh signal SR is enabled. The first address transfer circuit 540 may output the first internal address signal BK1_ADD<1:N> to the first bank 600 through the first to $N^{th}$ local I/O lines LIO<1:N>.

The second address transfer circuit 550 may generate the second internal address signal BK2_ADD<1:N> according to logic levels of the reset signal RST, the second command pulse signal CMDP<2>, and the first to $N^{th}$ decoded signals DEC<1:N> when the refresh signal SR is disabled. The second address transfer circuit 550 may generate the second internal address signal BK2_ADD<1:N> by performing an adding operation and a subtracting operation according to logic levels of the second command pulse signal CMDP<2> and the first to $N^{th}$ decoded signals DEC<1:N> based on the control signal SCON when the refresh signal SR is enabled. The second address transfer circuit 550 may output the second internal address signal BK2_ADD<1:N> to the second bank 700 through the $(N+1)^{th}$ to $2N^{th}$ local I/O lines LIO<(N+1):2N>.

The third address transfer circuit 560 may generate the third internal address signal BK3_ADD<1:N> according to logic levels of the reset signal RST, the third command pulse signal CMDP<3>, and the first to $N^{th}$ decoded signals DEC<1:N> when the refresh signal SR is disabled. The third address transfer circuit 560 may generate the third internal address signal BK3_ADD<1:N> by performing an adding operation and a subtracting operation according to logic levels of the third command pulse signal CMDP<3> and the first to $N^{th}$ decoded signals DEC<1:N> based on the control signal SCON when the refresh signal SR is enabled. The third address transfer circuit 560 may output the third internal address signal BK3_ADD<1:N> to the third bank 800 through the $(2N+1)^{th}$ to $3N^{th}$ local I/O lines LIO<(2N+1):3N>.

The fourth address transfer circuit 570 may generate the fourth internal address signal BK4_ADD<1:N> according to logic levels of the reset signal RST, the fourth command pulse signal CMDP<4>, and the first to $N^{th}$ decoded signals DEC<1:N> when the refresh signal SR is disabled. The fourth address transfer circuit 570 may generate the fourth internal address signal BK4_ADD<1:N> by performing an adding operation and a subtracting operation according to logic levels of the fourth command pulse signal CMDP<4> and the first to $N^{th}$ decoded signals DEC<1:N> based on the control signal SCON when the refresh signal SR is enabled.

The fourth address transfer circuit 570 may output the fourth internal address signal BK4_ADD<1:N> to the fourth bank 900 through the $(3N+1)^{th}$ to $L^{th}$ local I/O lines LIO<(3N+1):L>.

Figure 7:
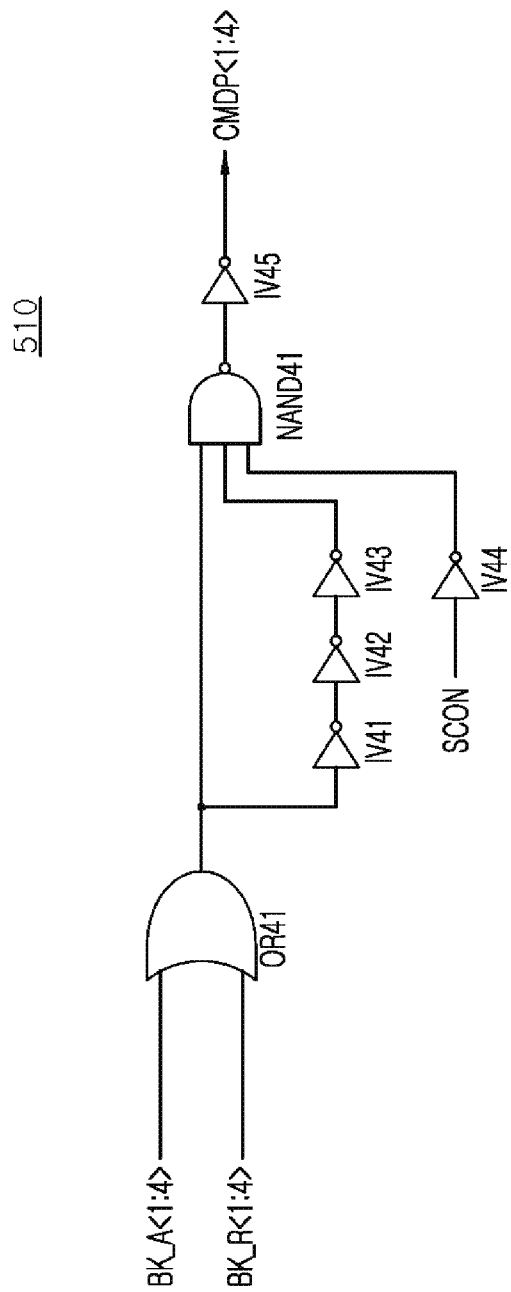
FIG. 7 is a circuit diagram illustrating a configuration of a pulse generation circuit included in the internal address generation circuit illustrated in FIG. 6.

Referring to FIG. 7, the pulse generation circuit 510 may be realized using inverters IV41, IV42, IV43, IV44, and IV45, an OR gate OR41, and a NAND gate NAND41.

The pulse generation circuit 510 may generate the first to fourth command pulse signals CMDP<1:4> which are disabled regardless of the first to fourth bank active address signals BK_A<1:4> and the first to fourth bank refresh address signals BK_R<1:4> while the reset signal RST is enabled to have a logic "high" level.

The pulse generation circuit 510 may generate the first to fourth command pulse signals CMDP<1:4> including pulses which are created when the first to fourth bank active address signals BK_A<1:4> or the first to fourth bank refresh address signals BK_R<1:4> are enabled to have a logic "high" level while the control signal SCON is enabled to have a logic "low" level.

The pulse generation circuit 510 may generate the first to fourth command pulse signals CMDP<1:4> which are disabled regardless of the first to fourth bank active address signals BK_A<1:4> and the first to fourth bank refresh address signals BK_R<1:4> while the control signal SCON is disabled to have a logic "high" level.

Although FIG. 7 illustrates the pulse generation circuit 510 with one circuit, the pulse generation circuit 510 may be actually realized using four circuits, each of which has the same configuration as the circuit illustrated in FIG. 7, according to the number of bits included in the first to fourth command pulse signals CMDP<1:4>.

Figure 8:
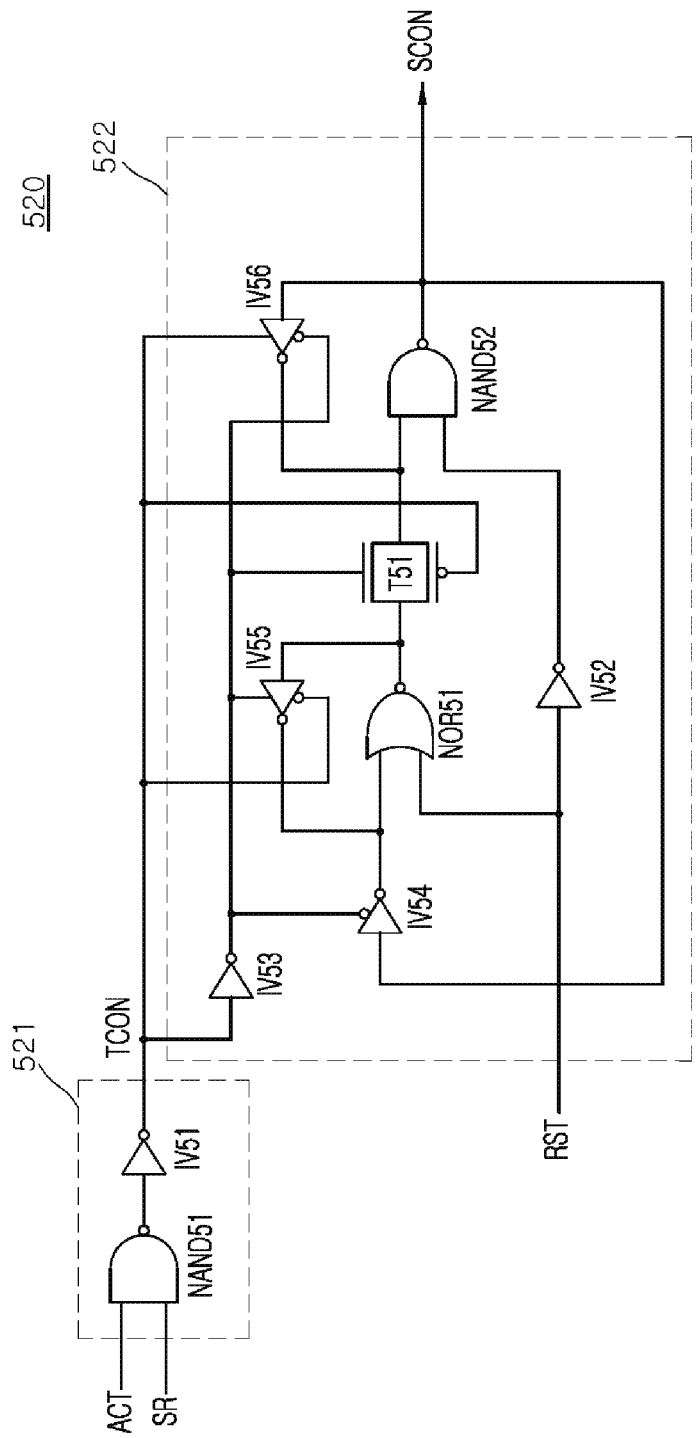
FIG. 8 is a circuit diagram illustrating a configuration of a control signal generation circuit included in the internal address generation circuit illustrated in FIG. 6.

Referring to FIG. 8, the control signal generation circuit 520 may include a transfer control signal generation circuit 521 and a signal transfer circuit 522.

The transfer control signal generation circuit 521 may be realized using a NAND gate NAND51 and an inverter IV51. The transfer control signal generation circuit 521 may generate a transfer control signal TCON having a logic "high" level when the active signal ACT has a logic "high" level and the refresh signal SR has a logic "high" level. The transfer control signal generation circuit 521 may generate the transfer control signal TCON having a logic "low" level when the active signal ACT has a logic "high" level and the refresh signal SR has a logic "low" level.

The signal transfer circuit 522 may be realized using inverters IV52, IV53, IV54, IV55, and IV56, a NOR gate NOR51, a NAND gate NAND51, and a transfer gate T51. The signal transfer circuit 522 may generate the control signal SCON which is disabled to have a logic "high" level when the reset signal RST having a logic "high" level is input. The signal transfer circuit 522 may invert the control signal SCON disabled by the reset signal RST to generate the control signal SCON enabled to have a logic "low" level, when the transfer control signal TCON is disabled after the transfer control signal TCON is enabled. The signal transfer circuit 522 may generate the control signal SCON which is enabled to have a logic "low" level when a logic level of the transfer control signal TCON changes from a logic "high" level into a logic "low" level.

Figure 9:
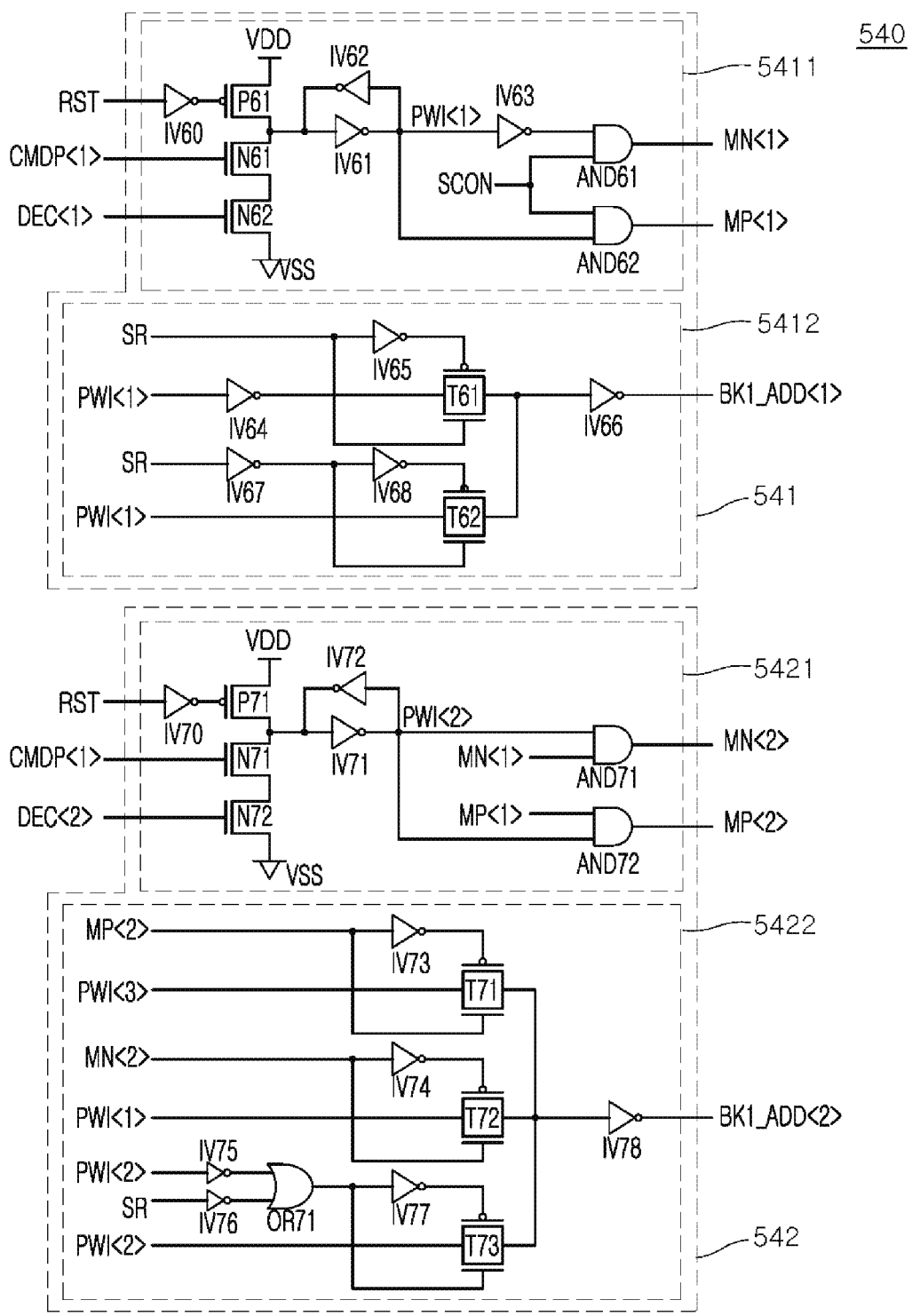
FIGS. 9 and 10 are circuit diagrams illustrating a configuration of a first address transfer circuit included in the internal address generation circuit illustrated in FIG. 6.
Figure 10:
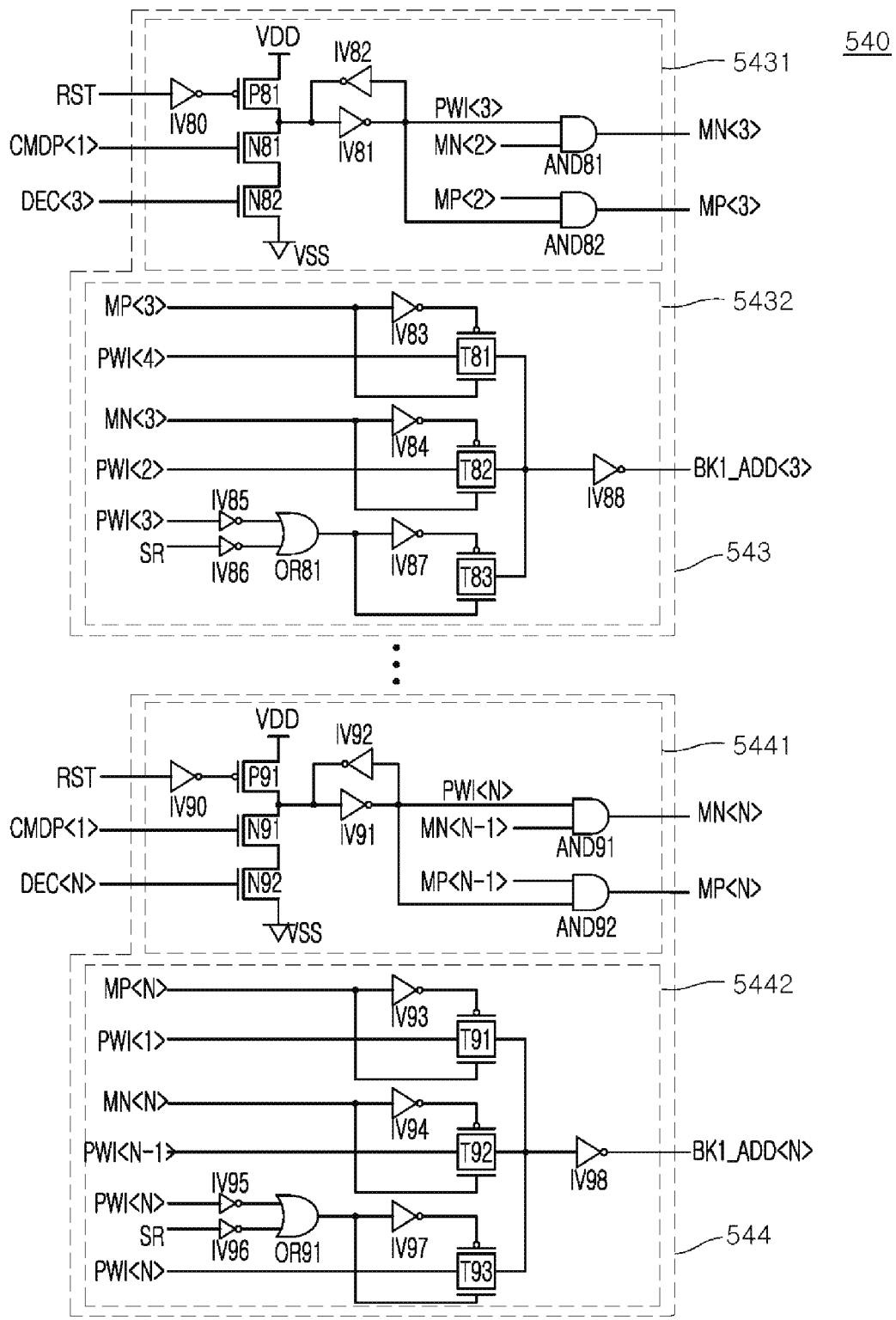

Referring to FIGS. 9 and 10, the first address transfer circuit 540 may include first, second, third, . . . , and $N^{th}$ arithmetic circuits 541, 542, 543, . . . , and 544.

The first arithmetic circuit 541 may include a first addition/subtraction signal generation circuit 5411 and a first selection/transfer circuit 5412.

The first addition/subtraction signal generation circuit 5411 may be realized using a PMOS transistor P61, NMOS transistors N61 and N62, inverters IV60, IV61, IV62, and IV63, and AND gates AND61 and AND62. The first addition/subtraction signal generation circuit 5411 may generate a first pre-word line signal PWI<1> having a logic "low" level when the reset signal RST is enabled to have a logic "high" level. The first addition/subtraction signal generation circuit 5411 may generate the first pre-word line signal PWI<1> having a logic "high" level when the first command pulse signal CMDP<1> is enabled to have a logic "high" level and the first decoded signal DEC<1> has a logic "high" level. The first addition/subtraction signal generation circuit 5411 may generate the first pre-word line signal PWI<1> having a logic "low" level when the first command pulse signal CMDP<1> is enabled to have a logic "high" level and the first decoded signal DEC<1> has a logic "low" level. The first addition/subtraction signal generation circuit 5411 may inversely buffer the first pre-word line signal PWI<1> to generate a first subtraction signal MN<1> when the control signal SCON is disabled to have a logic "high" level. The first addition/subtraction signal generation circuit 5411 may buffer the first pre-word line signal PWI<1> to generate a first addition signal MP<1> when the control signal SCON is disabled to have a logic "high" level.

The first selection/transfer circuit 5412 may be realized using inverters IV64, IV65, IV66, IV67, and IV68 and transfer gates T61 and T62. The first selection/transfer circuit 5412 may buffer the first pre-word line signal PWI<1> to generate a first bit signal BK1_ADD<1> of the first internal address signal BK1_ADD<1:N> when the refresh signal SR is enabled to have a logic "high" level. The first selection/transfer circuit 5412 may inversely buffer the first pre-word line signal PWI<1> to generate the first bit signal BK1_ADD<1> of the first internal address signal BK1_ADD<1:N> when the refresh signal SR is disabled to have a logic "low" level.

The second arithmetic circuit 542 may include a second addition/subtraction signal generation circuit 5421 and a second selection/transfer circuit 5422.

The second addition/subtraction signal generation circuit 5421 may be realized using a PMOS transistor P71, NMOS transistors N71 and N72, inverters IV70, IV71, and IV72, and AND gates AND71 and AND72. The second addition/subtraction signal generation circuit 5421 may generate a second pre-word line signal PWI<2> having a logic "low" level when the reset signal RST is enabled to have a logic "high" level. The second addition/subtraction signal generation circuit 5421 may generate the second pre-word line signal PWI<2> having a logic "high" level when the first command pulse signal CMDP<1> is enabled to have a logic "high" level and the second decoded signal DEC<2> has a logic "high" level. The second addition/subtraction signal generation circuit 5421 may generate the second pre-word line signal PWI<2> having a logic "low" level when the first command pulse signal CMDP<1> is enabled to have a logic "high" level and the second decoded signal DEC<2> has a logic "low" level. The second addition/subtraction signal generation circuit 5421 may buffer the second pre-word line signal PWI<2> to generate a second subtraction signal MN<2> when the first subtraction signal MN<1> is enabled to have a logic "high" level. The second addition/subtraction signal generation circuit 5421 may buffer the second pre-word line signal PWI<2> to generate a second addition signal MP<2> when the first addition signal MP<1> is enabled to have a logic "high" level.

The second selection/transfer circuit 5422 may be realized using inverters IV73, IV74, IV75, IV76, IV77, and IV78, an OR gate OR71, and transfer gates T71, T72, and T73. The second selection/transfer circuit 5422 may inversely buffer a third pre-word line signal PWI<3> generated by the third arithmetic circuit 543 to generate a second bit signal BK1_ADD<2> of the first internal address signal BK1_ADD<1:N> when the second addition signal MP<2> is enabled to have a logic "high" level. The second selection/transfer circuit 5422 may inversely buffer the first pre-word line signal PWI<1> generated by the first arithmetic circuit 541 to generate the second bit signal BK1_ADD<2> of the first internal address signal BK1_ADD<1:N> when the second subtraction signal MN<2> is enabled to have a logic "high" level. The second selection/transfer circuit 5422 may inversely buffer the second pre-word line signal PWI<2> to generate the second bit signal BK1_ADD<2> of the first internal address signal BK1_ADD<1:N> when one of the refresh signal SR and the second pre-word line signal PWI<2> is generated to have a logic "low" level.

The third arithmetic circuit 543 may include a third addition/subtraction signal generation circuit 5431 and a third selection/transfer circuit 5432.

The third addition/subtraction signal generation circuit 5431 may be realized using a PMOS transistor P81, NMOS transistors N81 and N82, inverters IV80, IV81, and IV82, and AND gates AND81 and AND82. The third addition/subtraction signal generation circuit 5431 may generate a third pre-word line signal PWI<3> having a logic "low" level when the reset signal RST is enabled to have a logic "high" level. The third addition/subtraction signal generation circuit 5431 may generate the third pre-word line signal PWI<3> having a logic "high" level when the first command pulse signal CMDP<1> is enabled to have a logic "high" level and the third decoded signal DEC<3> has a logic "high" level. The third addition/subtraction signal generation circuit 5431 may generate the third pre-word line signal PWI<3> having a logic "low" level when the first command pulse signal CMDP<1> is enabled to have a logic "high" level and the third decoded signal DEC<3> has a logic "low" level. The third addition/subtraction signal generation circuit 5431 may buffer the third pre-word line signal PWI<3> to generate a third subtraction signal MN<3> when the second subtraction signal MN<2> is enabled to have a logic "high" level. The third addition/subtraction signal generation circuit 5431 may buffer the third pre-word line signal PWI<3> to generate a third addition signal MP<3> when the second addition signal MP<2> is enabled to have a logic "high" level.

The third selection/transfer circuit 5432 may be realized using inverters IV83, IV84, IV85, IV86, IV87, and IV88, an OR gate OR81, and transfer gates T81, T82, and T83. The third selection/transfer circuit 5432 may inversely buffer a fourth pre-word line signal PWI<4> generated by the fourth arithmetic circuit (not shown) to generate a third bit signal BK1_ADD<3> of the first internal address signal BK1_ADD<1:N> when the third addition signal MP<3> is enabled to have a logic "high" level. The third selection/transfer circuit 5432 may inversely buffer the second pre-word line signal PWI<2> generated by the second arithmetic circuit 542 to generate the third bit signal BK1_ADD<3> of the first internal address signal BK1_ADD<1:N> when the third subtraction signal MN<3> is enabled to have a logic "high" level. The third selection/transfer circuit 5432 may inversely buffer the third pre-word line signal PWI<3> to generate the third bit signal BK1_ADD<3> of the first internal address signal BK1_ADD<1:N> when one of the refresh signal SR and the third pre-word line signal PWI<3> is generated to have a logic "low" level.

The $N^{th}$ arithmetic circuit 544 may include an $N^{th}$ addition/subtraction signal generation circuit 5441 and an $N^{th}$ selection/transfer circuit 5442.

The $N^{th}$ addition/subtraction signal generation circuit 5441 may be realized using a PMOS transistor P91, NMOS transistors N91 and N92, inverters IV90, IV91, and IV92, and AND gates AND91 and AND92. The $N^{th}$ addition/subtraction signal generation circuit 5441 may generate an $N^{th}$ pre-word line signal PWI<N> having a logic "low" level when the reset signal RST is enabled to have a logic "high" level. The $N^{th}$ addition/subtraction signal generation circuit 5441 may generate the $N^{th}$ pre-word line signal PWI<N> having a logic "high" level when the first command pulse signal CMDP<1> is enabled to have a logic "high" level and the $N^{th}$ decoded signal DEC<N> has a logic "high" level. The $N^{th}$ addition/subtraction signal generation circuit 5441 may generate the $N^{th}$ pre-word line signal PWI<N> having a logic "low" level when the first command pulse signal CMDP<1> is enabled to have a logic "high" level and the $N^{th}$ decoded signal DEC<N> has a logic "low" level. The $N^{th}$ addition/subtraction signal generation circuit 5441 may buffer the $N^{th}$ pre-word line signal PWI<N> to generate an $N^{th}$ subtraction signal MN<N> when an $(N-1)^{th}$ subtraction signal MN<N-1> is enabled to have a logic "high" level. The $N^{th}$ addition/subtraction signal generation circuit 5441 may buffer the $N^{th}$ pre-word line signal PWI<N> to generate an $N^{th}$ addition signal MP<N> when an $(N-1)^{th}$ addition signal MP<N-1> is enabled to have a logic "high" level.

The $N^{th}$ selection/transfer circuit 5442 may be realized using inverters IV93, IV94, IV95, IV96, IV97, and IV98, an OR gate OR91, and transfer gates T91, T92, and T93. The $N^{th}$ selection/transfer circuit 5442 may inversely buffer the first pre-word line signal PWI<1> generated by the first arithmetic circuit 541 to generate an $N^{th}$ bit signal BK1_ADD<N> of the first internal address signal BK1_ADD<1:N> when the $N^{th}$ addition signal MP<N> is enabled to have a logic "high" level. The $N^{th}$ selection/transfer circuit 5442 may inversely buffer an $(N-1)^{th}$ pre-word line signal PWI<N-1> generated by an $(N-1)^{th}$ arithmetic circuit (not shown) to generate the $N^{th}$ bit signal BK1_ADD<N> of the first internal address signal BK1_ADD<1:N> when the $N^{th}$ subtraction signal MN<N> is enabled to have a logic "high" level. The $N^{th}$ selection/transfer circuit 5442 may inversely buffer the $N^{th}$ pre-word line signal PWI<N> to generate the $N^{th}$ bit signal BK1_ADD<N> of the first internal address signal BK1_ADD<1:N> when one of the refresh signal SR and the $N^{th}$ pre-word line signal PWI<N> is generated to have a logic "low" level.

Meanwhile, each of the second to fourth address transfer circuits 550, 560, and 570 illustrated in FIG. 6 may be realized using substantially the same circuit as the first address transfer circuit 540 illustrated in FIGS. 9 and 10 except its input/output (I/O) signals. Thus, detailed descriptions of the second to fourth address transfer circuits 550, 560, and 570 will be omitted hereinafter.

Figure 11:
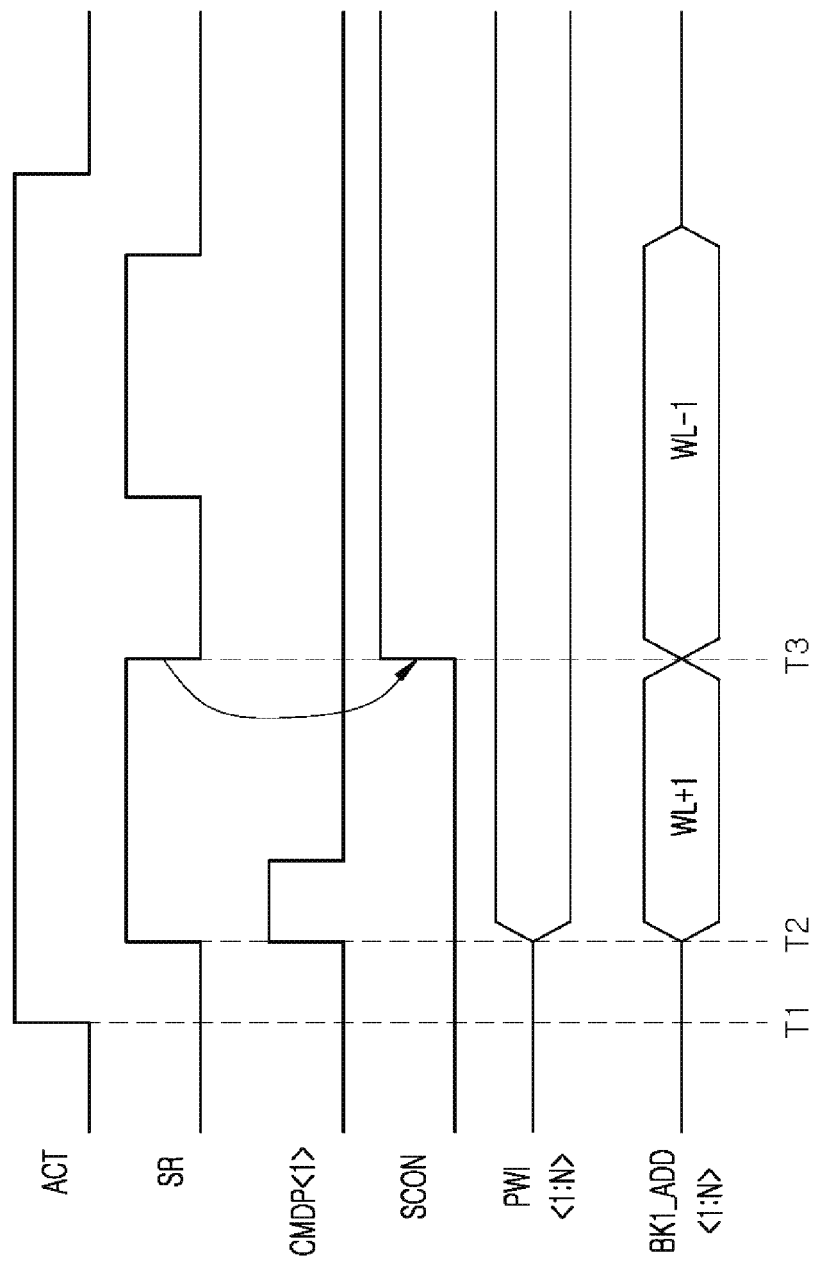
FIGS. 11 and 12 are timing diagrams illustrating an operation of a semiconductor device according to an embodiment of the present disclosure.

The smart refresh operation for the first bank 500 included in the semiconductor device 1 will be described hereinafter with reference to FIG. 11.

At a point in time "T1", the command decoder 100 may decode the command CMD to generate the active signal ACT having a logic "high" level.

At a point in time "T2", the command decoder 100 may decode the command CMD to generate the refresh signal SR including a first pulse having a logic "high" level.

The bank address generation circuit 200 may receive the (M+1)$^{th}$ and (M+2)$^{th}$ address signals ADD<(M+1):(M+2)> to generate the first bank refresh address signal BK_R<1> having a logic "high" level based on the active signal ACT and the refresh signal SR having logic "high" levels. The first bank refresh address signal BK_R<1> may be outputted from the bank address generation circuit 200 through the second global I/O line GIO<2>.

The target address generation circuit 300 may generate the first to M$^{th}$ target address signals RH_ADD<1:M> based on the refresh signal SR having a logic "high" level.

The address input circuit 400 may receive the first to M$^{th}$ target address signals RH_ADD<1:M> to generate the first to M$^{th}$ latch address signals LADD<1:M> based on the refresh signal SR and the first to fourth bank refresh address signals BK_R<1:4>. The first to M$^{th}$ latch address signals LADD<1:M> may be outputted from the address input circuit 400 through the ninth to K$^{th}$ global I/O lines GIO<9:K>.

The first address transfer circuit 540 of the internal address generation circuit 500 may generate the first to N$^{th}$ pre-word line signals PWI<1:N> according to logic levels of the first command pulse signal CMDP<1> and the first to N$^{th}$ decoded signals DEC<1:N> and may perform an adding operation (WL+1) of the first to N$^{th}$ pre-word line signals PWI<1:N> to generate the first internal address signal BK1_ADD<1: N>.

One of the first to N$^{th}$ word lines WL<1:N> included in the first bank 600 may be activated by the first internal address signal BK1_ADD<1:N>. In such a case, the activated word line means a word line (WL+1) next to a word line which is activated by the first to M$^{th}$ target address signals RH_ADD<1:M>.

At a point in time "T3", because the active signal ACT maintains a logic "high" level and the first pulse of the refresh signal SR is disabled to have a logic "low" level, the control signal generation circuit 520 may generate the control signal SCON which is disabled to have a logic "high" level.

The first address transfer circuit 540 of the internal address generation circuit 500 may generate the first to N$^{th}$ pre-word line signals PWI<1:N> according to logic levels of the first command pulse signal CMDP<1> and the first to N$^{th}$ decoded signals DEC<1:N> and may perform a subtracting operation (WL-1) of the first to N$^{th}$ pre-word line signals PWI<1:N> to generate the first internal address signal BK1_ADD<1:N>.

One of the first to N$^{th}$ word lines WL<1:N> included in the first bank 600 may be activated by the first internal address signal BK1_ADD<1:N>. In such a case, the activated word line means a word line (WL-1) previous to a word line which is activated by the first to M$^{th}$ target address signals RH_ADD<1:M>.

According to the semiconductor device 1 having an aforementioned configuration, during a smart refresh operation, a peripheral circuit of the semiconductor device 1 may generate a latch address signal from a target address signal and may output the latch address signal to a core circuit of the semiconductor device 1 through a global I/O line. The core circuit of the semiconductor device 1 may sequentially perform an adding operation and a subtracting operation of the latch address signal during a smart refresh operation. Thus, no extra global I/O line is required to transmit the latch address signals for performing the adding operation and the subtracting operation to the core circuit. Accordingly, it may be possible to reduce a layout area of the semiconductor device 1. In addition, because no extra global I/O line is required in the semiconductor device 1, it may prevent an error of the adding operation and the subtracting operation. Accordingly, the smart refresh operation may be efficiently performed.

Figure 12:
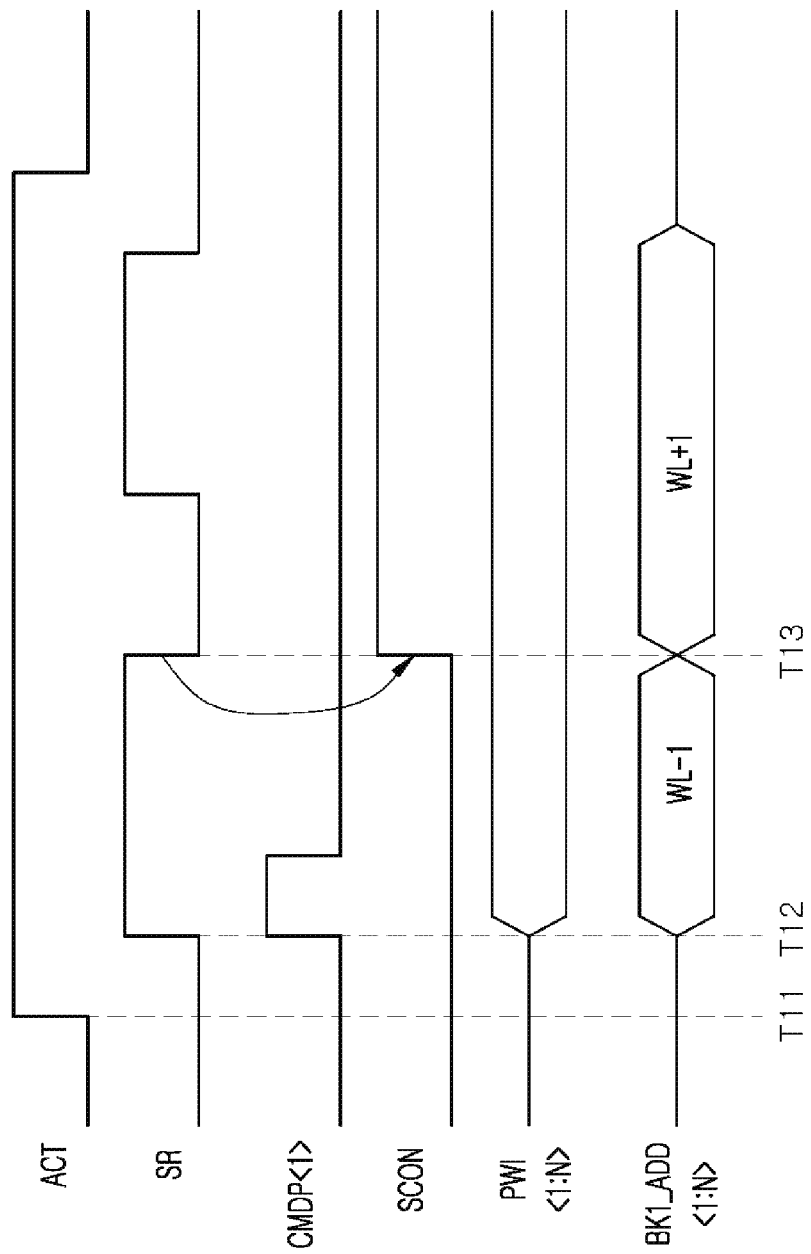

Another smart refresh operation for the first bank 500 included in the semiconductor device 1 will be described hereinafter with reference to FIG. 12.

At a point in time "T11", the command decoder 100 may decode the command CMD to generate the active signal ACT having a logic "high" level.

At a point in time "T12", the command decoder 100 may decode the command CMD to generate the refresh signal SR including a first pulse having a logic "high" level.

The bank address generation circuit 200 may receive the (M+1)$^{th}$ and (M+2)$^{th}$ address signals ADD<(M+1):(M+2)> to generate the first bank refresh address signal BK_R<1> having a logic "high" level based on the active signal ACT and the refresh signal SR having logic "high" levels. The first bank refresh address signal BK_R<1> may be outputted from the bank address generation circuit 200 through the second global I/O line GIO<2>.

The target address generation circuit 300 may generate the first to M$^{th}$ target address signals RH_ADD<1:M> based on the refresh signal SR having a logic "high" level.

The address input circuit 400 may receive the first to M$^{th}$ target address signals RH_ADD<1:M> to generate the first to M$^{th}$ latch address signals LADD<1:M> based on the refresh signal SR and the first to fourth bank refresh address signals BK_R<1:4>. The first to M$^{th}$ latch address signals LADD<1:M> may be outputted from the address input circuit 400 through the ninth to K$^{th}$ global I/O lines GIO<9:K>.

The first address transfer circuit 540 of the internal address generation circuit 500 may generate the first to N$^{th}$ pre-word line signals PWI<1:N> according to logic levels of the first command pulse signal CMDP<1> and the first to N$^{th}$ decoded signals DEC<1:N> and may perform a subtracting operation (WL-1) of the first to N$^{th}$ pre-word line signals PWI<1:N> to generate the first internal address signal BK1_ADD<1:N>.

One of the first to N$^{th}$ word lines WL<1:N> included in the first bank 600 may be activated by the first internal address signal BK1_ADD<1:N>. In such a case, the activated word line means a word line (WL-1) previous to a word line which is activated by the first to M$^{th}$ target address signals RH_ADD<1:M>.

At a point in time "T13", because the active signal ACT maintains a logic "high" level and the first pulse of the refresh signal SR is disabled to have a logic "low" level, the control signal generation circuit 520 may generate the control signal SCON which is disabled to have a logic "high" level.

The first address transfer circuit 540 of the internal address generation circuit 500 may generate the first to N$^{th}$ pre-word line signals PWI<1:N> according to logic levels of the first command pulse signal CMDP<1> and the first to N$^{th}$ decoded signals DEC<1:N> and may perform an adding operation (WL+1) of the first to N$^{th}$ pre-word line signals PWI<1:N> to generate the first internal address signal BK1_ADD<1:N>.

One of the first to N$^{th}$ word lines WL<1:N> included in the first bank 600 may be activated by the first internal address signal BK1_ADD<1:N>. In such a case, the activated word line means a word line (WL+1) next to a word line which is activated by the first to M$^{th}$ target address signals RH_ADD<1:M>.

According to the semiconductor device 1 having an aforementioned configuration, during a smart refresh operation, a peripheral circuit of the semiconductor device 1 may generate a latch address signal from a target address signal and may output the latch address signal to a core circuit of the semiconductor device 1 through a global I/O line. The core circuit of the semiconductor device 1 may sequentially perform a subtracting operation and an adding operation of the latch address signal during a smart refresh operation. Thus, no extra global I/O line is required to transmit the latch address signals for performing the adding operation and the subtracting operation to the core circuit. Accordingly, it may be possible to reduce a layout area of the semiconductor device 1. In addition, because no extra global I/O line is required in the semiconductor device 1, it may prevent an error of the adding operation and the subtracting operation. Accordingly, the smart refresh operation may be efficiently performed.

Figure 13:
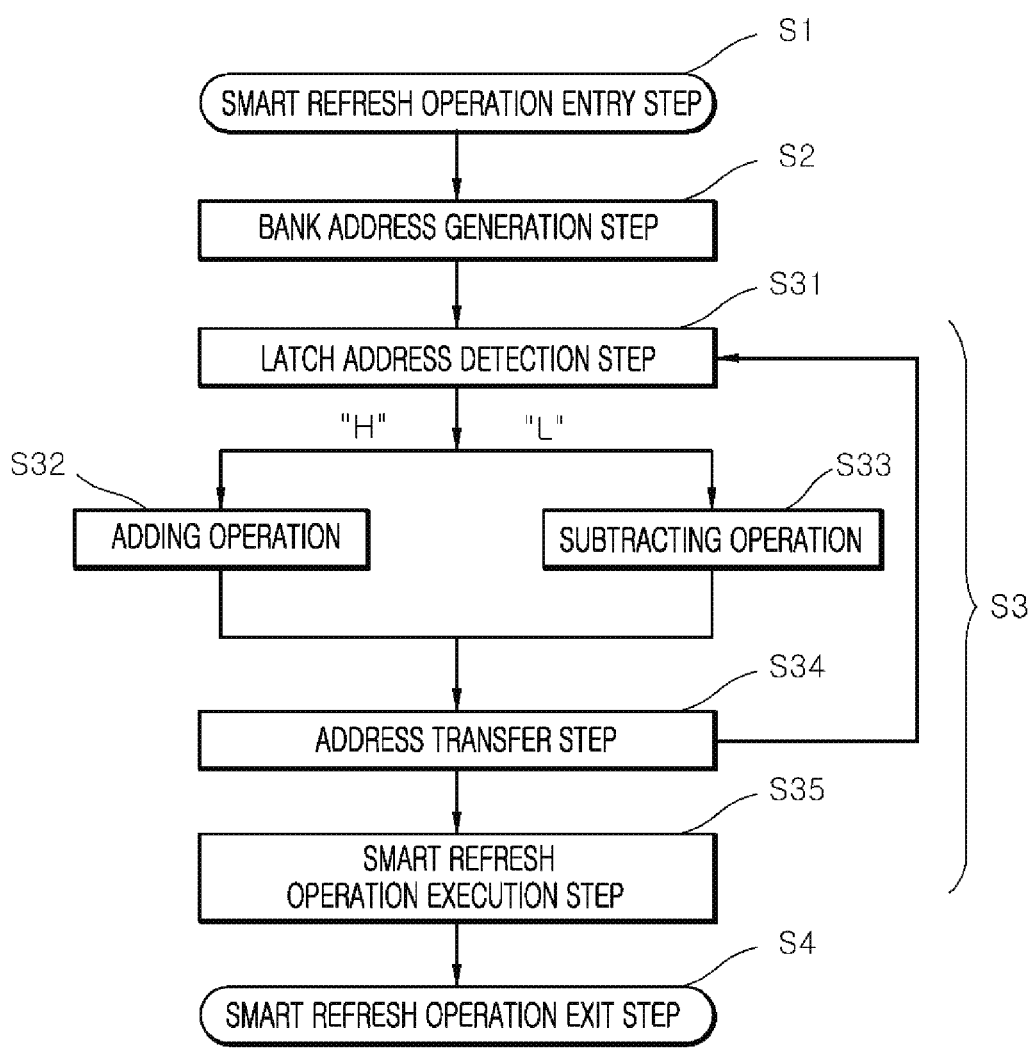
FIG. 13 is a flowchart illustrating a smart refresh method according to an embodiment of the present disclosure.

A refresh method according to an embodiment of the present disclosure will be described hereinafter with reference to FIG. 13.

The command decoder 100 may decode the command CMD provided by an external device to generate the active signal ACT which is enabled to perform the smart refresh operation and may generate the refresh signal SR including a first pulse created during the smart refresh operation to execute a smart refresh operation entry step S1.

The bank address generation circuit 200 may receive the $(M+1)^{th}$ and $(M+2)^{th}$ address signals ADD<(M+1):(M+2)> based on the active signal ACT and the first pulse of the refresh signal SR to execute a bank address generation step S2 for generating the first to fourth bank refresh address signals BK_R<1:4>.

The target address generation circuit 300 may generate the first to $M^{th}$ target address signals RH_ADD<1:M> based on the first pulse of the refresh signal SR.

The address input circuit 400 may generate the first to $M^{th}$ latch address signals LADD<1:M> from the first to $M^{th}$ target address signals RH_ADD<1:M> based on the first pulse of the refresh signal SR and the first to fourth bank refresh address signals BK_R<1:4>.

The internal address generation circuit 500 may execute a latch address detection step S31 that detects logic levels of the first to $M^{th}$ latch address signals LADD<1:M> based on the active signal ACT and the first pulse of the refresh signal SR.

The internal address generation circuit 500 may perform an adding operation when one of bit signals of the first to $N^{th}$ decoded signals DEC<1:N> generated by the first to $M^{th}$ latch address signals LADD<1:M> has a logic "high" level (see a step S32). The internal address generation circuit 500 may perform the adding operation step S32 to execute an address transfer step S34 for generating the first to fourth internal address signals BK1_ADD<1:N>, BK2_ADD<1:N>, BK3_ADD<1:N>, and BK4_ADD<1:N>. In addition, the internal address generation circuit 500 may perform a subtracting operation when one of bit signals of the first to $N^{th}$ decoded signals DEC<1:N> generated by the first to $M^{th}$ latch address signals LADD<1:M> has a logic "low" level (see a step S33).

The core circuit 20 may execute a smart refresh operation execution step S35 based on the first to fourth internal address signals BK1_ADD<1:N>, BK2_ADD<1:N>, BK3_ADD<1:N>, and BK4_ADD<1:N> which are generated by the adding operation step S32. Alternatively, the core circuit 20 may execute the smart refresh operation execution step S35 based on the first to fourth internal address signals BK1_ADD<1:N>, BK2_ADD<1:N>, BK3_ADD<1:N>, and BK4_ADD<1:N> which are generated by the subtracting operation step S33.

The latch address detection step S31, the adding operation step S32, the subtracting operation step S33, the address transfer step S34, and the smart refresh operation execution step S35 may constitute an internal address generation step S3.

The command decoder 100 may decode the command CMD provided by an external device to generate the active signal ACT which is enabled and the refresh signal SR which is disabled, for activation of the smart refresh mode.

The internal address generation circuit 500 may receive the active signal ACT and the refresh signal SR to generate the control signal SCON which is disabled to have a logic "high" level. The internal address generation circuit 500 may execute the address transfer step S34 again by detecting logic levels of the first to $M^{th}$ latch address signals LADD<1:M> based on the control signal SCON which is enabled to have a logic "high" level. The internal address generation circuit 500 may perform the subtracting operation S33 of the first to $N^{th}$ decoded signals DEC<1:N>. The internal address generation circuit 500 may perform the subtracting operation S33 to re-execute the address transfer step S34 generating the first to fourth internal address signals BK1_ADD<1:N>, BK2_ADD<1:N>, BK3_ADD<1:N>, and BK4_ADD<1:N>. When the subtracting operation S33 is performed first, the adding operation S32 may be performed after the subtracting operation S33 is performed.

The core circuit 20 may execute the smart refresh operation execution step S35 again based on the first to fourth internal address signals BK1_ADD<1:N>, BK2_ADD<1:N>, BK3_ADD<1:N>, and BK4_ADD<1:N> which are generated by the subtracting operation step S33.

According to the semiconductor device 1 having an aforementioned configuration, during a smart refresh operation, a peripheral circuit of the semiconductor device 1 may generate a latch address signal from a target address signal and may output the latch address signal to a core circuit of the semiconductor device 1 through a global I/O line. The core circuit of the semiconductor device 1 may sequentially perform an adding operation and a subtracting operation of the latch address signal during a smart refresh operation. Thus, no extra global I/O line is required to transmit the latch address signals for performing the adding operation and the subtracting operation to the core circuit. Accordingly, it may be possible to reduce a layout area of the semiconductor device 1. In addition, because no extra global I/O line is required in the semiconductor device 1, it may prevent an error of the adding operation and the subtracting operation. Accordingly, the smart refresh operation may be efficiently performed.

Figure 14:
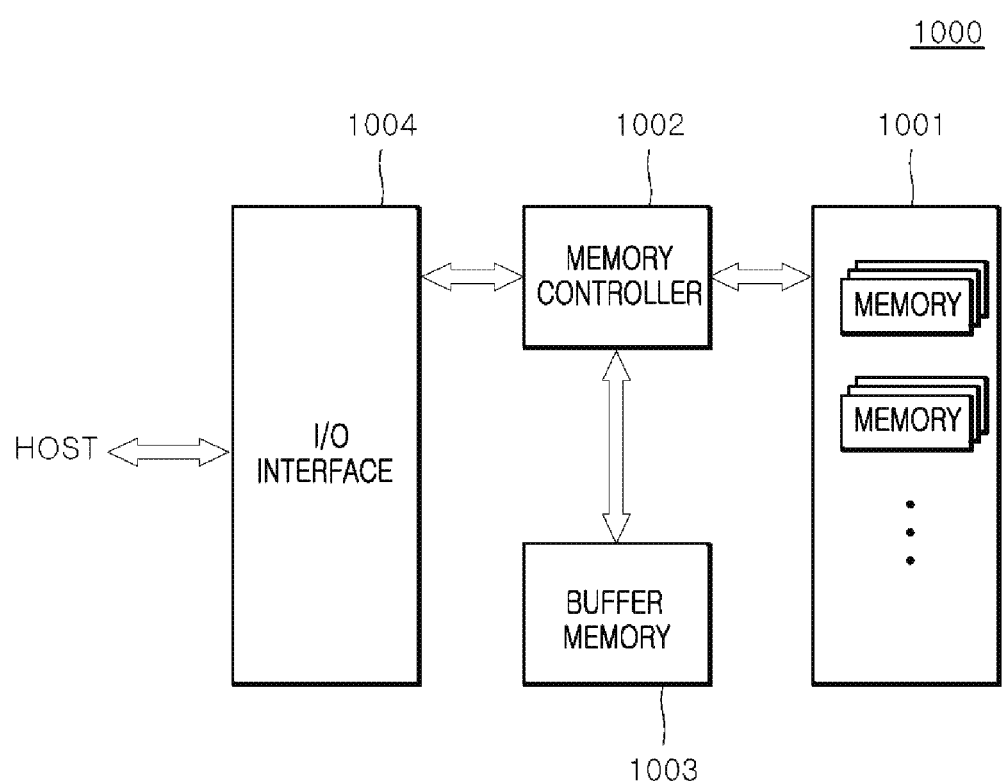
FIG. 14 is a block diagram illustrating a configuration of an electronic system including the semiconductor device illustrated in FIGS. 1 to 12.

The semiconductor device 1 described with reference to FIGS. 1 to 12 may be applied to an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device 1 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be input to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host device). Thus, the memory controller 1002 may receive control signals and data supplied from the external device (i.e., the host device) through the I/O interface 1004 and may output the data generated from the memory controller 1002 to the external device (i.e., the host device) through the I/O interface 1004. That is, the electronic system 1000 may communicate with the host device through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
 a peripheral circuit configured to enter a smart refresh mode in which a smart refresh operation is performed based on a command and configured to generate a latch address signal from a target address signal in the smart refresh mode to output the latch address signal through a global input/output (I/O) line; and
 a core circuit configured to successively perform an adding operation and a subtracting operation of the latch address signal to generate first and second internal address signals when a refresh signal input and configured to successively perform the smart refresh operation twice for first and second banks based on the first and second internal address signals, and
 wherein, the target address signal is a signal generated by outputting the target address stored in a target address generation circuit when the refresh signal is input.

2. The semiconductor device of claim 1, wherein the smart refresh operation is an operation for activating two word lines disposed to be adjacent to a word line which is selected by the target address signal.

3. The semiconductor device of claim 1, wherein an execution sequence of the adding operation and the subtracting operation is determined by logic levels of bit signals of the target address signal.

4. The semiconductor device of claim 1, wherein the target address signal includes information on locations of word lines which are activated at least a predetermined number of times among all of word lines included in the first and second banks.

5. The semiconductor device of claim 1, wherein the peripheral circuit includes:
 a command decoder configured to decode the command to generate an active signal and the refresh signal;
 a bank address generation circuit configured to receive an address signal to generate first and second bank active address signals and first and second bank refresh address signals when the active signal and the refresh signal are enabled;
 the target address generation circuit configured to generate the target address signal when the refresh signal is input; and
 an address input circuit configured to generate the latch address signal from the address signal when the first and second bank active address signals are input and configured to receive the target address signal to generate the latch address signal when the first and second bank refresh address signals are input.

6. The semiconductor device of claim 5, wherein the bank address generation circuit includes:
 a bank active address generation circuit configured to receive the address signal to generate the first and second bank active address signals when the active signal is input; and
 a bank refresh address generation circuit configured to receive the address signal to generate the first and second bank refresh address signals when the refresh signal is input.

7. The semiconductor device of claim 6,
 wherein the bank active address generation circuit enables one of the first and second bank active address signals according to logic levels of the address signal when the active signal is input, and
 wherein the bank refresh address generation circuit enables one of the first and second bank refresh address signals according to logic levels of the address signals when the refresh signal is input.

8. The semiconductor device of claim 1, wherein the core circuit includes an internal address generation circuit configured to sequentially perform the adding operation and the subtracting operation of the latch address signal to generate the first and second internal address signals in the smart refresh mode.

9. The semiconductor device of claim 8, wherein the internal address generation circuit includes:
- a pulse generation circuit configured to generate first and second command pulse signals including pulses which are generated from the first to second bank active address signals or the first and second bank refresh address signals when a control signal is not input;
- a control signal generation circuit configured to generate the control signal which is disabled when a reset signal is input and which is enabled by the active signal and the refresh signal;
- an address decoder configured to decode the latch address signal to generate decoded signals, one of which is selectively enabled;
- a first address transfer circuit configured to generate the first internal address signal according to logic levels of the first command pulse signal and the decoded signals while the control signal disabled by the reset signal is input and configured to generate the first internal address signal by performing the adding operation and the subtracting operation according to logic levels of the refresh signal, the first command pulse signal, and the decoded signals while the control signal is enabled; and
- a second address transfer circuit configured to generate the second internal address signal according to logic levels of the second command pulse signal and the decoded signals while the control signal disabled by the reset signal is input and configured to generate the second internal address signal by performing the adding operation and the subtracting operation according to logic levels of the refresh signal, the second command pulse signal, and the decoded signals while the control signal is enabled.

10. The semiconductor device of claim 9, wherein the control signal generation circuit includes:
- a transfer control signal generation circuit configured to generate a transfer control signal which is enabled when the active signal and the refresh signal are input; and
- a signal transfer circuit configured to generate the control signal which is disabled when the reset signal is input and which is enabled when the transfer control signal is enabled.

11. The semiconductor device of claim 10, wherein the signal transfer circuit is configured to invert the control signal disabled by the reset signal to generate the control signal enabled when the transfer control signal is disabled after the transfer control signal is enabled.

12. A semiconductor device comprising:
- an address input circuit configured to generate a latch address signal from a target address signal to output the latch address signal through a global input/output (I/O) line during a smart refresh operation;
- an internal address generation circuit configured to generate first and second internal address signals by successively performing an adding operation and a subtracting operation of the latch address signal based on first and second bank active address signals and first and second bank refresh address signals when a refresh signal is input and configured to output the first and second internal address signals through a local I/O line; and
- a core circuit including a first bank and a second bank, configured to successively perform the smart refresh operation twice for the first bank based on the first internal address signal, and configured to successively perform the smart refresh operation twice for the second bank based on the second internal address signal, and wherein, the target address signal is a signal generated by outputting the target address stored in a target address generation circuit when the refresh signal is input.

13. The semiconductor device of claim 12, wherein the smart refresh operation is an operation for activating two word lines disposed to be adjacent to a word line which is selected by the target address signal.

14. The semiconductor device of claim 12, wherein an execution sequence of the adding operation and the subtracting operation is determined by logic levels of bit signals of the target address signal.

15. The semiconductor device of claim 12, wherein the target address signal includes information on locations of word lines which are activated at least a predetermined number of times among all of word lines included in the first and second banks.

16. The semiconductor device of claim 12, wherein the address input circuit includes:
- a first input circuit configured to generate an input address signal from an address signal when the first bank active address signal is input and configured to generate the input address signal from the target address signal when the refresh signal and the first bank refresh address signal are input;
- a second input circuit configured to generate the input address signal from the address signal when the second bank active address signal is input and configured to generate the input address signal from the target address signal when the refresh signal and the second bank refresh address signal are input; and
- a latch circuit configured to latch the input address signal and configured to generate the latch address signal from the latched input address signal.

17. The semiconductor device of claim 12, wherein the internal address generation circuit includes:
- a pulse generation circuit configured to generate first and second command pulse signals including pulses which are generated from the first to second bank active address signals or the first and second bank refresh address signals when a control signal is not input;
- a control signal generation circuit configured to generate the control signal which is disabled when a reset signal is input and which is enabled by an active signal and the refresh signal;
- an address decoder configured to decode the latch address signal to generate decoded signals, one of which is selectively enabled;
- a first address transfer circuit configured to generate the first internal address signal according to logic levels of the first command pulse signal and the decoded signals while the control signal disabled by the reset signal is input and configured to generate the first internal address signal by performing the adding operation and the subtracting operation according to logic levels of the refresh signal, the first command pulse signal, and the decoded signals while the control signal is enabled; and
- a second address transfer circuit configured to generate the second internal address signal according to logic levels of the second command pulse signal and the decoded signals while the control signal disabled by the reset signal is input and configured to generate the second internal address signal by performing the adding operation and the subtracting operation according to logic levels of the refresh signal, the second command pulse signal, and the decoded signals while the control signal is enabled.

18. The semiconductor device of claim 17, wherein the control signal generation circuit includes:
    a transfer control signal generation circuit configured to generate a transfer control signal which is enabled when the active signal and the refresh signal are input; and
    a signal transfer circuit configured to generate the control signal which is disabled when the reset signal is input and which is enabled when the transfer control signal is enabled.

19. The semiconductor device of claim 18, wherein the signal transfer circuit is configured to invert the control signal disabled by the reset signal to generate the control signal enabled when the transfer control signal is disabled after the transfer control signal is enabled.

20. A refresh method comprising:
    generating a bank active address signal and a bank refresh address signal from an address signal during a smart refresh operation;
    generating a latch address signal from a target address signal during the smart refresh operation; and
    generating the internal address signal by successively performing an adding operation and a subtracting operation according to a logic level of a specific bit signal of the latch address signal when a refresh signal input to successively perform the smart refresh operation twice for a bank which is activated according to the bank active address signal and the bank refresh address signal, and
    wherein, the target address signal is a signal generated by outputting the target address stored in a target address generation circuit when the refresh signal is input.

21. The refresh method of claim 20, wherein the bank active address signal and the bank refresh address signal are generated from at least one specific bit signal of the address signal for activating the bank.

22. The refresh method of claim 20, wherein the target address signal includes information on locations of word lines which are activated at least a predetermined number of times among all of word lines included in the bank.

23. The refresh method of claim 20,
    wherein the subtracting operation is performed after the adding operation is performed when the specific bit signal of the latch address signal has a first logic level during the smart refresh operation; and
    wherein the adding operation is performed after the subtracting operation is performed when the specific bit signal of the latch address signal has a second logic level during the smart refresh operation.

* * * * *